United States Patent [19]
Aoyagi et al.

[11] Patent Number: 5,550,855
[45] Date of Patent: Aug. 27, 1996

[54] OPTICAL MODULATOR

[75] Inventors: Toshitaka Aoyagi; Hitoshi Watanabe; Yasunori Miyazaki; Kunihiko Isshiki, all of Itami, Japan

[73] Assignee: Mitsubishi Denki Kabushiki Kaisha, Tokyo, Japan

[21] Appl. No.: 237,308

[22] Filed: May 3, 1994

[30] Foreign Application Priority Data

Jul. 23, 1993 [JP] Japan .................................. 5-182414

[51] Int. Cl.⁶ .................................................. H01S 3/18
[52] U.S. Cl. .................. 372/50; 372/28; 372/32
[58] Field of Search .................. 372/50, 28, 32, 372/96

[56] References Cited

U.S. PATENT DOCUMENTS 5,238,799  2/1994  Jacquet et al. ........................... 372/50

FOREIGN PATENT DOCUMENTS

| 0128297 | 4/1984 | European Pat. Off. . |
|---|---|---|
| 3057286 | 7/1989 | Japan . |
| 357285 | 3/1991 | Japan . |
| 3293622 | 12/1991 | Japan . |
| 3295289 | 12/1991 | Japan . |
| 4198913 | 7/1992 | Japan . |

OTHER PUBLICATIONS

Ellis et al., "Dispersion Compensation in 450 km Transmission System Employing Standard Fibre", Electronics Letter & vol. 28, No. 10, May 7, 1992, pp. 954–955.

Ishikawa, H., "Monolithic Laser Light Sources for Advanced Optical Communications", Japanese Journal of Applied Physics, Supplements. 22th Conference on Solid State and Materials (1990) No. SB7, 1990, Tokyo, Japan pp. 785–788 (No month available).

Fishman, D. A., "Design and Performance of Externally Modulated 1.5-μm Laser Transmitter in the Presence of Chromatic Dispersion", Journal of Lightwave Technology, vol. 11, No. 4, Apr. 1993, New York, USA., pp. 624–632.

Lourtioz et al, "Fourier–Transform–Limited Pulses from Gain–Switched Distributed–Bragg–Reflector Lasers Using Simultaneous Modulation of Gain and Phase Sections", Electronics Letters, 30 Jul., 1992, vol. 28, No. 16, pp. 1499–1500.

Mak et al, "High–Speed Bulk InGaAsP–InP Electroabsorption Modulators With Bandwidth In Excess Of 20 GHz", IEEE Photonics Technology Letters, vol. 2, No. 10, Oct. 1990, pp. 730–733.

Primary Examiner—Rodney B. Bovernick
Assistant Examiner—Robert McNutt
Attorney, Agent, or Firm—Leydig, Voit & Mayer

[57] ABSTRACT

In an optical modulator including a laser light source emitting laser light and a modulator, a modulation signal source for applying a modulation signal to the modulator, a signal processor for producing and outputting a signal in response to a change in the modulation signal, and a driving current source for generating a driving current applied to the laser light. Wavelength chirping modulation reverse to the wavelength chirping occurring in the modulator is produced in the light emitted from the laser by modulation of the driving current whereby wavelength chirping produced by the modulator is at least partially cancelled and wavelength chirping of the light output from the modulator is reduced.

11 Claims, 22 Drawing Sheets modulation signal
voltage differentiated
waveform current wavelength chirping
in the wavelength
variable laser wavelength chirping
in the output of
the optical modulator modulation signal
voltage output current
of the inverter wavelength chirping
in the wavelength
variable laser wavelength chirping
in the output of
the optical modulator modulation signal voltage output current of the inverter wavelength chirping in the wavelength variable laser wavelength chirping in the output of the optical modulator output current of the inverter modulation signal voltage output voltage of the inverter wavelength chirping in the wavelength variable laser wavelength chirping in the output of the optical modulator positive phase reverse phase Δt reverse phase
+ positive phase
(pulse signal)

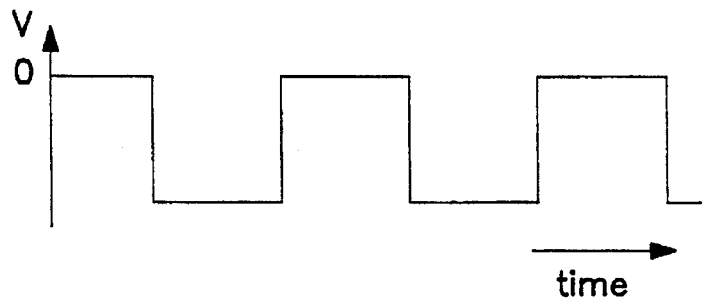
FIG. 11(a) modulation signal voltage
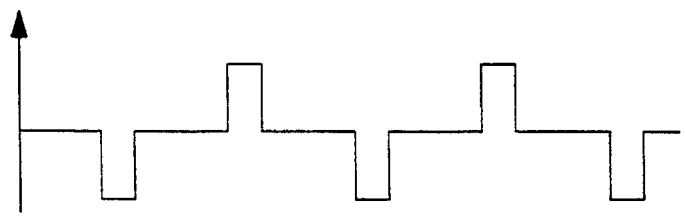
FIG. 11(b) pulse signal current output voltage of the inverter
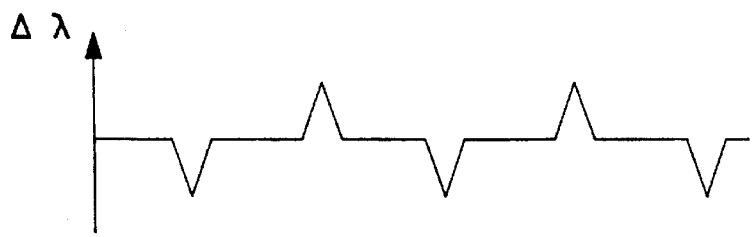
FIG. 11(c) wavelength chirping in the wavelength variable laser
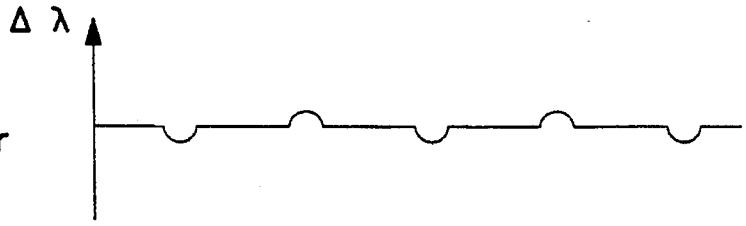
FIG. 11(d) wavelength chirping in the output of the optical modulator modulation signal voltage pulse signal current wavelength chirping in the wavelength variable laser wavelength chirping in the output of the optical modulator modulation signal voltage the first pulse signal current a wavelength chirping in the wavelength variable laser wavelength chirping in the output of the optical modulator the second pulse signal current b modulation
signal
voltage modulation
signal
optical output refractive index wavelength
chirping
in the
optical modulator

OPTICAL MODULATOR

FIELD OF THE INVENTION

The present invention relates to an optical modulator provided with a laser light source and, more particularly, to an optical modulator that performs a high speed long distance transmission.

BACKGROUND OF THE INVENTION

FIG. 21 is a diagram showing a construction of a prior art optical modulator provided with a distributed feedback laser (hereinafter referred to as DFB laser) having a light absorbing layer of multi-quantum well structure. In the figure, reference numeral 1 designates a DFB laser having a resonator length of 300–600 µm, a width of 300 µm, and a thickness of 100 µm. Reference numeral 2 designates an optical modulator provided with the DFB laser 1, having a length of 100–300 µm, a width of 300 µm, and a thickness of 100 µm.

In the DFB laser 1, a positive side electrode 3 is provided as an electrode of the laser diode 1. An electrode 4 is provided as a common grounding electrode for the DFB laser 1 and the optical modulator 2. An active layer 6 is provided as active layer of the DFB laser 1.

In the optical modulator 2, a light absorbing layer 7 comprises a multi-quantum well structure including twelve quantum well layers 4–5 nm thick, putting between barrier layers 8–10 nm thick, and its total thickness is 140 nm. An optical modulator negative side electrode 8 is an electrode for inputting a modulation signal to the optical modulator 2. A signal voltage source 9 supplies a modulation signal to the optical modulator negative side electrode 8. Reference numeral 10 designates a modulated signal light that is obtained by modulating the output light from the DFB laser 1 by the modulation signal that is output from the signal voltage source 9.

FIGS. 22(*a*) to 22(*d*) are diagrams for explaining the operation of the optical modulator 2, where FIG. 22(*a*) shows the change in the modulation signal voltage which is applied to the optical modulator 2. FIG. 22(*b*) shows the change in the modulated signal light output, occurring when the modulation signal is applied, and FIG. 22(*c*) shows the change in the refractive index of the light absorbing layer 7 of the optical modulator 2, also occurring then. FIG. 22(*d*) shows the wavelength chirping (frequency variation) occurring in the optical modulator 2.

A description is given of the operation of the optical modulator.

First of all, when a D.C. current is flown in the DFB laser 1 as a light source from the LD positive side electrode 3 to the common grounding electrode 4, a continuous wave (CW) laser light is generated in the active layer 6 and the CW laser light transmits in the active layer 6 toward the optical modulator 2. Then, the CW laser light advancing toward the light absorbing layer 7 of the optical modulator 2 is incident to the optical modulator 2.

The light absorbing layer 7 is of a multi-quantum well structure, and when no voltage is applied between the common grounding electrode 4 and the optical modulator negative side electrode 8 of the optical modulator 2, the light absorbing layer 7 makes the CW laser light incident to the light absorbing layer 7 transmit therethrough, while when a voltage is applied between the common grounding electrode 4 and the optical modulator negative side electrode 8, the light absorbing layer 7 absorbs the CW laser light only during when a voltage bias is applied, due to the quantum confining Stark effect.

In other words, when a voltage of modulation signal in a waveform as shown in FIG. 22(*a*) is applied to the optical modulator negative side electrode 8, during a period when the modulation signal voltage is at a negative level, the light absorbing layer 7 absorbs the CW laser light, whereby no laser light appears at the output side thereof, and the modulated signal light output is turned off. On the other hand, during when the modulation signal voltage is at 0 voltage level, the CW laser light transmits the light absorption layer 7, whereby the modulated signal light output becomes on. Then, the waveform of the modulated signal light 10 becomes a waveform as shown in FIG. 22(*b*) in accordance with the variation in the modulation signal voltage.

In the prior art optical modulator constituted as described above, the quantum confining Stark effect of the multi-quantum well structure light absorbing layer in an absorbing type optical modulator is of a nature that the absorbing quantity generally increases when an electric field is applied. As the light absorbing quantity increases, the refractive index in the light absorbing layer increases as shown in FIG. 22(*c*) due to the relation of Kramers-Kroning, and the refractive index again decreases when no electric field is applied. With the refractive index varies, i.e., with the quantity of transmission/absorption varies, the optical length varies and the wavelength of the modulated signal light, that is output from the optical modulator output facet varies, thereby resulting chirping as shown in FIG. 22(*d*). The quantity Δλ of this wavelength chirping is about several Å for the wavelength of 1.55–1.56 µm, the modulator of which wavelength is generally used because it produces the least transmission loss. When this wavelength chirping is large, the optical signal is subjected to distortion through the optical fiber transmission, thereby resulting in difficulty in performing a high speed long distance transmission.

SUMMARY OF THE INVENTION

It is an object of the present invention to provide an optical modulator that reduces the optical chirping of the modulated signal light and that achieves a high speed long distance transmission.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, an optical modulator includes an optical modulator itself for modulating a laser light, a wavelength variable laser for emitting a laser light, that is to be modulated and the wavelength of which is variable, means for applying a modulation signal to the optical modulator, means for producing and outputting a signal in response to the change in the voltage of a modulation signal, means for generating a driving current to be applied to the wavelength variable laser as a laser light source, and means for synthesizing the output signal of the signal producing means and the driving current, and applying the synthesized output to the laser light source.

According to a second aspect of the present invention, the optical modulator of the above-described first aspect is a semiconductor optical modulator integrated with the wavelength variable laser, disposing a common grounding electrode on its rear surface. Two or more electrodes are disposed on the upper surface of the wavelength variable laser in the resonator length direction. A high reflectivity film is disposed on the rear end facet of the wavelength variable laser and a low reflectivity film is disposed on the output facet of the optical modulator.

According to a third aspect of the present invention, in the optical modulator of the above-described second aspect, the two or more electrodes disposed on the wavelength variable laser are a laser diode front side electrode at the front side of the upper surface of the wavelength variable laser and a laser diode rear side electrode at the rear side of the upper surface of the wavelength variable laser. The modulation means serves to apply a modulation voltage signal between the optical modulator electrode on the upper surface of the optical modulator and the common grounding electrode. The signal producing means, including a differentiating circuit, differentiates the modulation signal applied to the optical modulator to produce and output a differentiated waveform current. The driving current generating means includes a front side electrode D.C. current source and a rear side electrode D.C. current source respectively outputting prescribed D.C. currents. The signal synthesizing means serves to synthesize the differentiated waveform current that has passed through a D.C. blocking condenser and the driving current that has passed through an A.C. blocking coil.

According to a fourth aspect of the present invention, in the optical modulator of the above-described second aspect, the two or more electrodes disposed on the wavelength variable laser includes a laser diode front side electrode at the front side of the upper surface of the wavelength variable laser and an LD rear side electrode at the rear side of the upper surface of the wavelength variable laser. The modulating means serves to apply a modulation voltage signal between the optical modulator electrode on the upper surface of the optical modulator and the common grounding electrode. The signal producing means includes a bridge circuit including a transmission line producing no delay, a delay line involving a required delay quantity, and an inverter, and it serves to add a signal, that is obtained by the modulation signal applied to the optical modulator being delayed, and a modulation signal including no delay in reverse phases to each other, thereby producing and outputting a pulse signal having a pulse width corresponding to the delay time difference. The driving current generating means includes a front side electrode D.C. current source and a rear side electrode D.C. current source respectively outputting prescribed D.C. currents, and the signal synthesizing means Serves to synthesize the pulse signal, that has passed through a D.C. blocking condenser, and the driving current, that has passed through an A.C. blocking coil.

According to a fifth aspect of the present invention, in the optical modulator of the above-described third aspect, the front side electrode D.C. current source is connected to the laser diode front side electrode, to the laser diode rear side electrode, the differentiating circuit is connected via the D.C. blocking condenser as well as the rear side electrode D.C. current source is connected via the A.C. blocking coil, and to the laser diode rear side electrode, a current that is obtained by the differentiated waveform current being added to a D.C. current from the rear side electrode D.C. current source, is applied.

According to a sixth aspect of the present invention, in the optical modulator of the above-described third aspect, the signal producing means includes an inverter at the output end of the differentiating circuit and serves to output a differentiated waveform current, that is obtained by inverting the phase of the differentiated waveform current, to the laser diode front side electrode, the inverter is connected via the D.C. blocking condenser as well as the front side D.C. current source is connected via the A.C. blocking coil, to the laser diode rear side electrode the rear side electrode D.C. current source is connected, and to the laser diode front side electrode a current that is obtained by adding the phase-inverted differentiated waveform to a D.C. current from the front side electrode D.C. current source, is applied.

According to a seventh aspect of the present invention, in the optical modulator of the above-described third aspect, the signal producing means includes an inverter connected to the output end of the differentiating circuit, and it outputs a differentiated waveform current which is an output of the differentiating circuit and an inverted differentiated waveform current that is obtained by inverting the phase of the differentiated waveform current, to the laser diode front side electrode the inverter is connected via a D.C. blocking condenser and the front side electrode D.C. current source is connected via an A.C. blocking coil, to the laser diode rear side electrode the differentiating circuit is connected via another D.C. blocking condenser and the rear side electrode D.C. current source is connected via another A.C. blocking coil, and to the laser diode front side electrode a current that is obtained by adding the phase-inverted differentiated waveform current to a D.C. current from the front side electrode D.C. current source is applied, and to the laser diode rear side electrode a current that is obtained by adding the differentiated waveform current to a D.C. current from the rear side electrode D.C. current source, is applied.

According to an eighth aspect of the present invention, in the optical modulator of the above-described third aspect, the modulating means includes an inverter for inverting the phase of the modulation signal, to the laser diode front side electrode the differentiating circuit is connected via the D.C. blocking condenser and the front side electrode D.C. current source is connected via the A.C. blocking coil, to the laser diode rear side electrode the rear side electrode D.C. current source is connected, and to the optical modulator electrode the phase inverted modulation signal is applied, and to the laser diode front side electrode a current that is obtained by adding the differentiated waveform current to a D.C. current from the front side electrode D.C. current source, is applied.

According to a ninth aspect of the present invention, in the optical modulator of the above-described fourth aspect, the bridge circuit includes a first bridge circuit that is obtained by connecting the delay line and the inverter in series to each other and connecting the transmission line in parallel with this serial connection, to the laser diode front side electrode the front side electrode D.C. current source is connected, to the laser diode rear side electrode the first bridge circuit is connected via the D.C. blocking condenser and the rear side electrode D.C. current source is connected via the A.C. blocking coil, and to the laser diode rear side electrode a signal that is obtained by adding a pulse signal that is output from the first bridge circuit to a D.C. current from the rear side electrode D.C. current source, is applied.

According to a tenth aspect of the present invention, in the optical modulator of the above-described fourth aspect, the bridge circuit includes a second bridge circuit that is obtained by connecting the inverter and the transmission line in series to each other, and connecting the delay line in parallel with this serial connection, to the laser diode front side electrode the second bridge circuit is connected via the D.C. blocking condenser and the front side electrode D.C.

current source is connected via the A.C. blocking coil, to the laser diode rear side electrode the rear side electrode D.C. current source is connected, and to the laser diode front side electrode a signal that is obtained by adding a pulse signal that is output from the second bridge circuit to a D.C. current from the front side electrode D.C. current source, is applied.

According to an eleventh aspect of the present invention, in the optical modulator of the above-described fourth aspect, the bridge circuit includes a first bridge circuit producing and outputting a first pulse signal, which circuit is obtained by connecting a delay line and an inverter in serial to each other and connecting a transmission line in parallel with this serial connection, and a second bridge circuit producing and outputting a second pulse signal, which circuit is obtained by connecting an inverter and a transmission line in serial to each other and connecting a delay line in parallel with the serial connection, to the laser diode front side electrode the second bridge circuit is connected via a D.C. current blocking condenser and the front side electrode D.C. current source is connected via an A.C. blocking coil, to the laser diode rear side electrode the first bridge circuit is connected via another D.C. blocking condenser and the rear side electrode D.C. current source is connected via another A.C. blocking coil, and to the laser diode front side electrode a current that is obtained by adding the second pulse signal to a D.C. current from the front side electrode D.C. current source, is applied, and to the laser diode rear side electrode a current that is obtained by adding the first pulse signal to a D.C. current from the rear side electrode D.C. current source, is applied.

According to a twelfth aspect of the present invention, the optical modulator of any of the above-described third to eleventh aspects, the modulation means is provided with a delay line having a required delay quantity, to the optical modulator electrode the delay line is connected, and to the optical modulator electrode a modulation signal that is delayed by the delay line, is applied.

In the present invention, in an optical modulator provided with a laser light source emitting a laser light to be modulated by an optical modulator, the laser light source is made a wavelength variable laser that emits a laser light the wavelength of which is variable, and there are provided modulation means for applying a modulation signal to the optical modulator, signal producing means for producing and outputting a signal in response to the change in the modulation signal voltage, driving current generating means for generating a driving current to be applied to the laser light source, and signal synthesizing means for synthesizing the output signal of the signal producing means and the driving current and applying the synthesized output to the laser light source. Therefore, the driving current of the laser light source is varied in response to the change in the modulation signal by the output signal of the signal producing means, and a wavelength chirping reverse to the wavelength chirping occurring in the optical modulator is given to the laser light that is emitted from the laser light source. Thereby, the wavelength chirping occurring in the optical modulator is canceled, and the wavelength chirping of the modulated signal light that is emitted from the optical modulator is reduced.

BRIEF DESCRIPTION OF THE DRAWINGS

FIGS. 11(a)–11(d) are diagrams for explaining the operation of the optical modulator according to the fifth embodiment of the present invention.

DETAILED DESCRIPTION OF THE PREFERRED EMBODIMENT

Embodiment 1

Figure 1:
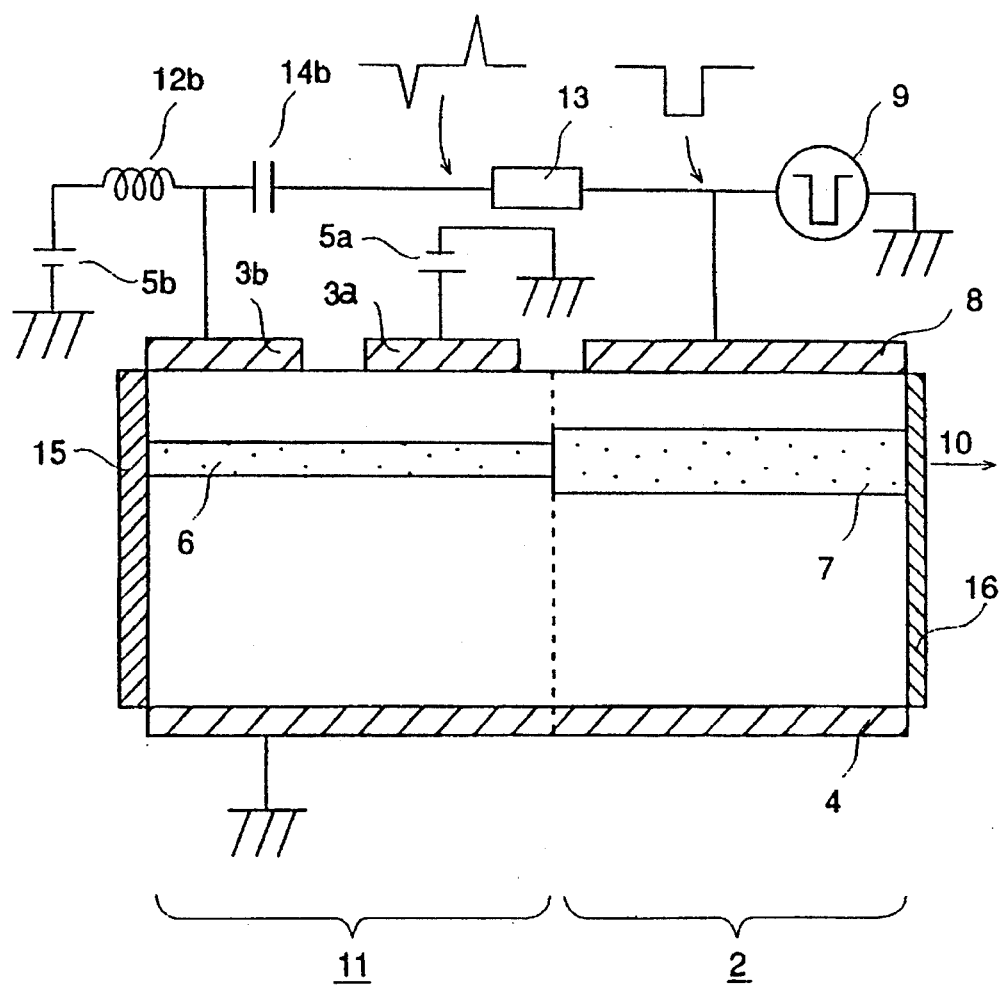
FIG. 1 is a diagram illustrating a structure of an optical modulator according to a first embodiment of the present invention.

FIG. 1 is a diagram illustrating an optical modulator according to a first embodiment of the present invention.

In the figure, reference numeral 11 designates a wavelength variable laser of a DFB structure having a resonator length of 300–600 μm, a width of 300 μm, and a thickness of 100 μm. Reference numeral 2 designates an optical modulator provided with the wavelength variable laser 11, having a length of 100–300 μm, a width of 300 μm, and a thickness of 100 μm. A common grounding electrode 4 is provided common to the wavelength variable LD 11 and the optical modulator 2.

The wavelength variable laser 11 includes an active layer 6. An LD front side electrode 3a and an LD rear side electrode 3b are disposed on the surface of the LD at a front position and at a rear position, respectively. A front side electrode D.C. power supply 5a is provided between the ground and the front side electrode 3a. A rear side electrode D.C. power supply 5b is provided between the ground and the rear side electrode 3b via a coil 12b for blocking alternate current (hereinafter also referred as A.C.). A signal voltage source 9 is provided as a source for supplying a modulation signal. A differentiating circuit 13 is provided for differentiating the modulation signal supplied from the signal voltage source 9. A condenser 14b for blocking direct current (D.C.) is connected to the output of the differentiating circuit 13. A high reflectivity film 15 having a reflectivity of 60–100 % is provided at the rear facet of the wavelength variable laser diode 11.

In the optical modulator 2, a light absorbing layer 7 is of a multi-quantum well structure laminating twelve quantum well layers of 4–5 nm thickness putting between barrier layers of 8–10 nm thickness, and having a total thickness of 140 nm. A low reflectivity film 16 having reflectivity below 3% is formed at the front side output facet of the optical modulator 2. An optical modulator negative side electrode 8 is disposed at the surface of the optical modulator 2, and the signal voltage source 9 is for supplying a modulation signal to the optical modulator negative side electrode 8 and the differentiating circuit 13. Reference numeral 10 designates a modulated signal light that is obtained by modulating the light emitted from the wavelength variable laser 11 by the modulation signal voltage output from the signal voltage source 9.

Figure 2A:
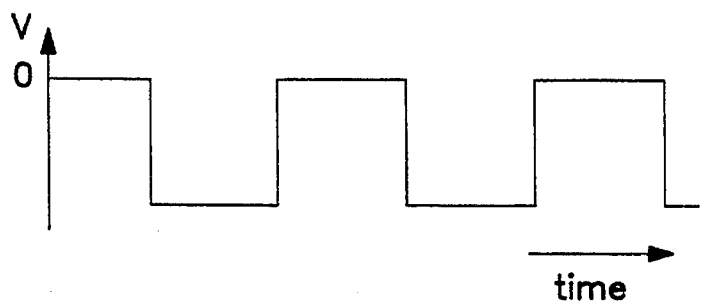
FIGS. 2(a)–2(d) are diagrams for explaining the operation of the optical modulator according to the first embodiment of the present invention.
Figure 2B:
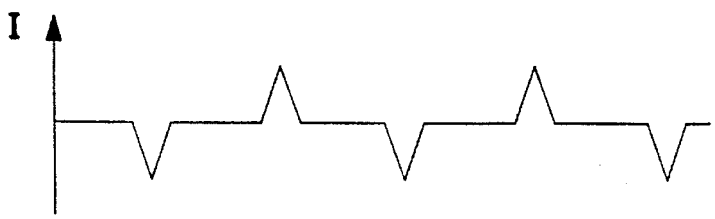
Figure 2C:
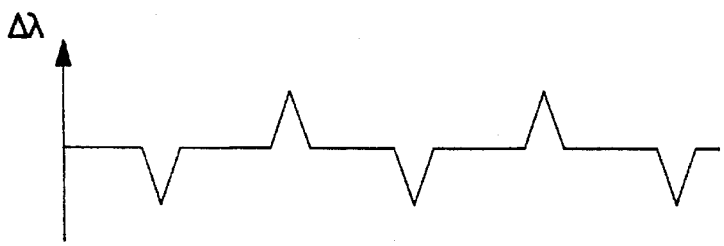
Figure 2D:
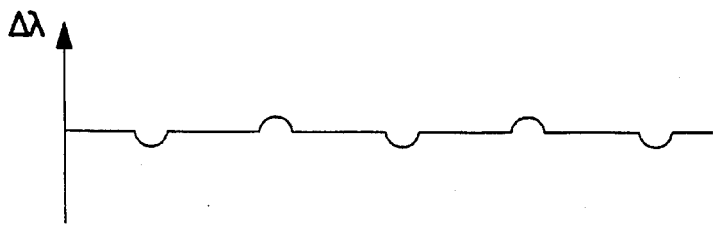

FIGS. 2(a)–2(d) are diagrams for explaining the operation of the optical modulator according to the first embodiment of the present invention, where FIG. 2(a) shows a change in the modulation signal voltage applied to the optical modulator 2, and FIG. 2(b) shows a change in the differentiated waveform current which is differentiated by the differentiating circuit 13. FIG. 2(c) shows wavelength chirping occurring in the wavelength variable laser 11 when the differentiated current waveform is flown to the LD rear side electrode 3b, and FIG. 2(d) shows wavelength chirping included in the output of the optical modulator 2.

A description is given of the operation.

First of all, the wavelength variable laser 11 as a light source is a plural electrode laser of a DFB structure, and a D.C. current is flown from the LD front side electrode 3a to the common grounding electrode 4 by means of the D.C. current source 5a. In addition, a D.C. current is flown from the LD rear side electrode 3b to the common grounding electrode 4 via the A.C. blocking coil 12b by means of the D.C. current source 5b, and additionally a differentiated waveform current as shown in FIG. 2(b) that is obtained by differentiating the modulation signal, is flown from the signal voltage source 9 through the differentiating circuit 13 and the D.C. blocking condenser 14b, and a laser light occurs in the active layer 6 caused by these currents. More particularly, when supposed that the center wavelength of the laser light is 1.55–1.56 μm, if the area of the LD front side electrode 3a and the area of the LD rear side electrode 3b are equal to each other, the current value of the D.C. current source 5a is several mA, and the current value of the D.C. current source 5b is 30 mA.

Now suppose that "rear electrode current / front electrode current"=γ.

In the optical modulator provided with this variable wavelength laser 11, a high reflectivity film 15 is coated on the facet at the side of the LD rear side electrode 3b of the wavelength variable laser 11 and a low reflectivity film 16 is coated on the output facet of the optical modulator 2. Therefore, the wavelength variable laser 11 has a nature of occurring hole burning that is stronger at the side of the high reflectivity film 15 than at the side of the low reflectivity film 16 during its oscillation, and as the injection current ratio γ decreases, that is, the rear side electrode current decreases, hole burning eminently occurs because carriers injected to the side of the high reflectivity film 15 decrease, whereby the wavelength of the laser light generated in the active layer 6 is shortened, while as the injection current ratio γ increases, that is, the rear side electrode current increases, occurrence of the hole burning is suppressed because carriers injected to the side of the high reflectivity film 15 increase, whereby the wavelength of the laser light generated in the active layer 6 is lengthened. In this way, the center wavelength of the laser light emitted from the wavelength variable laser 11 is varied.

In addition, a differentiated current waveform that is obtained by differentiating the modulation signal shown in FIG. 2(b) is applied to the LD rear side electrode 3b in addition to the D.C. current from the D.C. current source 5b as described above, and because at the falling down of the waveform of the modulation signal voltage shown in FIG. 2(a), the differentiated waveform current cancels the D.C. current from the D.C. current source 5b, the injection current ratio γ decreases during when the differentiated waveform is output, while because the differentiated waveform current is added to the D.C. current from the D.C. current source 5b at the rising up of the waveform of the modulation signal voltage, the injection current ratio γ increases during when the differentiated waveform is output. Therefore, the wavelength of the laser light emitted from the wavelength variable laser 11 varies dependent on the differentiated current waveform, thereby arising a wavelength chirping as shown in FIG. 2(c).

Figure 22A:
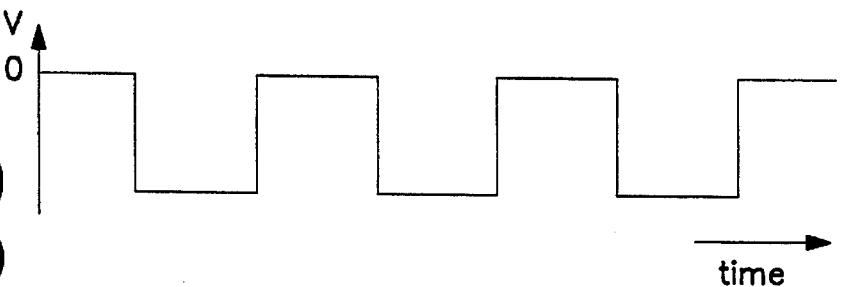
FIGS. 22(a)–22(d) are diagrams for explaining the operation of the optical modulator with a DFB laser according to the prior art.
Figure 22B:
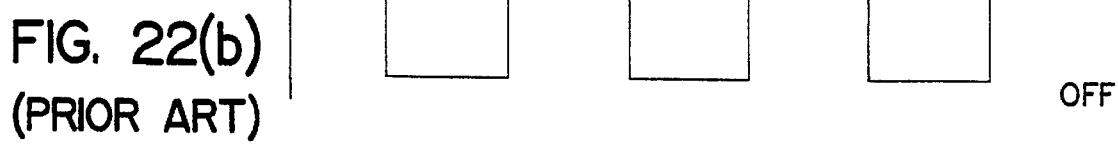
Figure 22C:
Figure 22D:
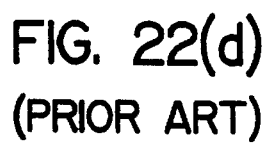

The laser light including the above-described wavelength chirping is incident to the light absorbing layer 7 of the optical modulator 2 and is modulated by a signal voltage applied thereto. Then, it is subjected to the original wavelength chirping accompanying the quantum confining Stark effect of the optical modulator 2 as shown in FIG. 22(d), and this wavelength chirping and the wavelength chirping (shown in FIG. 2(c)) that is obtained by applying the differentiated modulation signal to the LD rear side electrode 3b cancel with each other, whereby the wavelength chirping of the modulated signal light 10 that is emitted from the output facet of the optical modulator 2 is eminently reduced as shown in FIG. 2(d).

Japanese Published Patent Application No. 3-295289 discloses an integrated semiconductor device and a driving method therefore in which two electrodes are formed in an integrated semiconductor device having a high reflectivity facet and a low reflectivity facet, a D.C. current and a modulation current are applied to the electrode at the side of the high reflectivity facet, and a D.C. current is applied to the electrode at the low reflectivity facet. However, this publication intends to adjust the current value that flows to the electrode at the side of the high reflectivity facet, thereby suppressing the spatial hole burning and making the distribution of carrier density uniform. Further, this publication intends to apply a modulation current to the electrode at the side of the high reflectivity facet, thereby realizing an FM response characteristics of red shift (frequency shifted to the longer wavelength side), and obtaining a high FM modulation efficiency due to the dividing the integrated semiconductor device into two. Therefore, this has no relation to the optical modulator of the first embodiment of the present invention in which a differentiated current waveform produced by differentiating the modulation signal to be applied to the optical modulator 2, is flown to the LD rear side electrode 3b of the wavelength variable laser 11 which is provided with the optical modulator 2, in addition to a driving current for the wavelength variable laser 11, whereby wavelength chirping in a reverse direction to that occurring in the optical modulator 2 that has previously occurred in the laser light emitted from the wavelength variable laser 11, thereby canceling the wavelength chirping occurring in the optical modulator 2.

Japanese Patent Published Application 4-198913 discloses an electric field absorbing type semiconductor optical modulator which has a light absorbing layer having an equivalent thickness that becomes gradually thinner toward output side from input side, or a diffraction grating having a constant width and a constant period of convex, and a depth of convex that becomes gradually shallower output side from input side, or a diffraction grating having a constant width and a constant depth of convex, and a period of convex that becomes gradually shorter toward output side from input side, thereby preventing variation in refractive index or variation in absorption coefficient of an optical modulator. In this publication, it is intended to solve a problem that because the intensity of light that is absorbed in the vicinity of input side is extraordinarily larger than that in the vicinity of output side, a large amount of heat arises at the input side, thereby inviting variations in the refractive index and in the absorption coefficient of the optical modulator in a process of the light being absorbed accompanying the travel of the light along the light absorbing layer from the input side to the output side. It is also intended to lower the light absorption rate in the light absorbing layer at input side where the absolute value of transmitting light is large, and to raise the light absorption rate in the light absorbing layer at output side where the absolute value of transmitting light is small, thereby making the modulation effect uniform over the entirety of the light absorbing layer. In the electric field absorbing type semiconductor optical modulator of this publication, however, when absorption/transmission of light is performed in this optical modulator, there would arise a variation in the refractive index according to the relation of Kramers-Kroning and there would arise wavelength chirping when the refractive index thus varies. Therefore, the optical modulator of this first embodiment of the present invention can also be applied to this electric field absorbing type optical modulator, thereby resulting in reduction in the wavelength chirping in this optical modulator.

As described above, in the optical modulator of this first embodiment, a D.C. current from the front side surface electrode D.C. current source 5a is flown to the LD front side electrode 3a in the wavelength variable laser 11 provided in the optical modulator 2, and a current that is obtained by adding a differentiated waveform current that is obtained by differentiating the modulation signal that is generated from the modulation signal voltage source 9 to a D.C. current from the rear surface electrode D.C. current source 5b, is flown to the LD rear side electrode 3b, so as to drive the wavelength variable laser 11. Thereby, wavelength chirping is previously given to the laser light that is generated in the active layer 6 of the wavelength variable laser 11, and it cancels the wavelength chirping occurring in the optical modulator 2, whereby the wavelength chirping of the modulated signal light 10 that is emitted from the output facet of the optical modulator 2, is reduced.

While in this first embodiment the wavelength variable laser 11 is made a semiconductor laser of DFB structure, any semiconductor laser that oscillates at a single mode, for example, a DBR (distributed Bragg reflector) laser can be employed with the same effects as described above.

Embodiment 2

A second embodiment of the present invention will be described.

Figure 3:
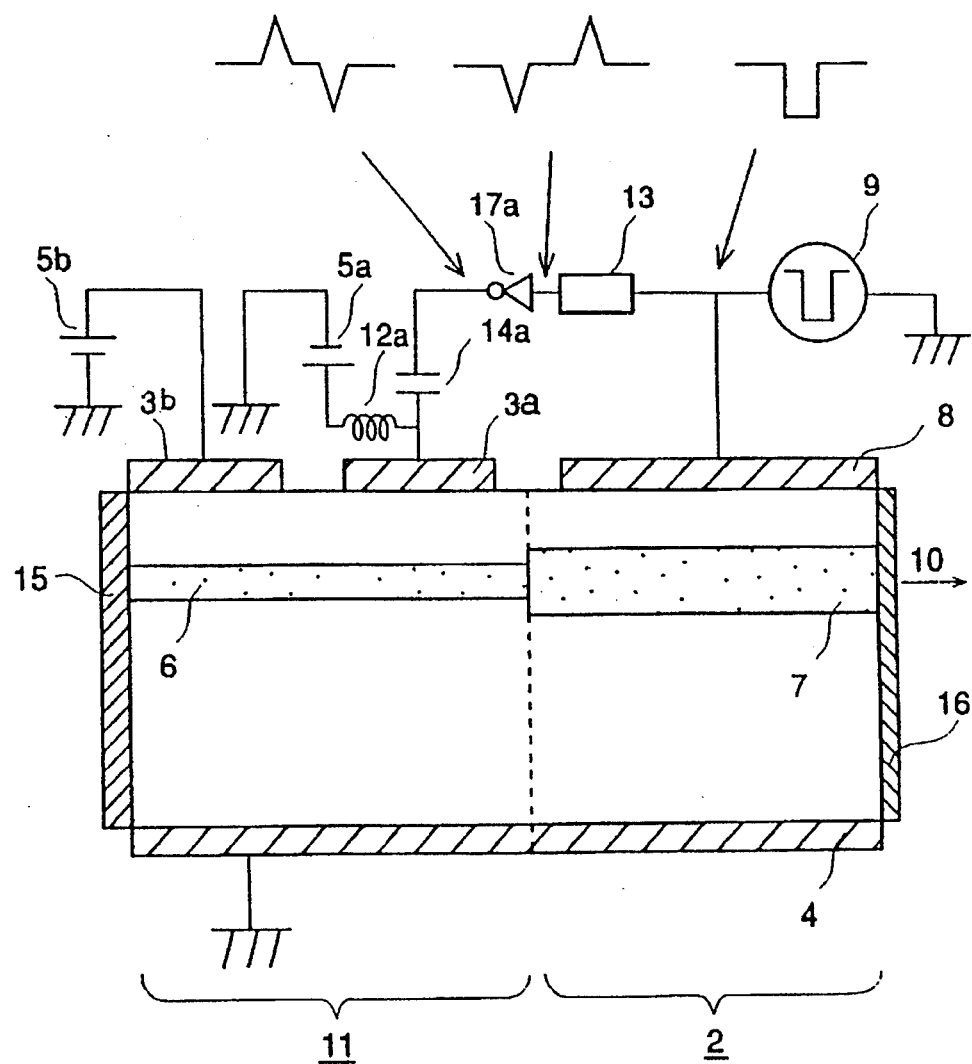
FIG. 3 is a diagram illustrating a structure of an optical modulator according to a second embodiment of the present invention.

FIG. 3 shows a construction of an optical modulator according to a second embodiment of the present invention. In the FIG., the same reference numerals as those in FIG. 1 are used to designate the same or corresponding elements. Reference numeral 12a designates a coil for blocking alternate current (AC), reference numeral 14a designates a condenser for blocking direct current (DC), and reference numeral 17a designates an inverter connected to the output terminal of the differentiating circuit 13.

FIGS. 4(a)–4(d) are diagrams for explaining the operation of the optical modulator according to the second embodiment, and the operation will be described hereinafter.

Figure 4A:
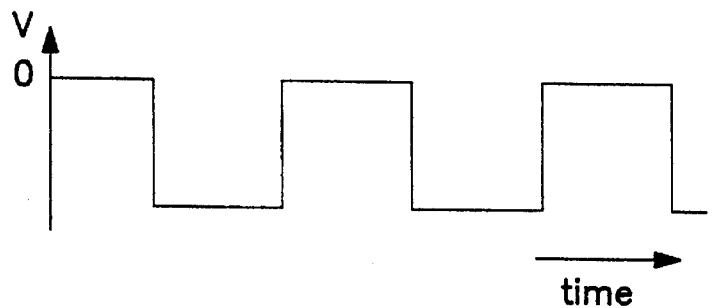
FIGS. 4(a)–4(d) are diagrams for explaining the operation of the optical modulator according to the second embodiment of the present invention.
Figure 4B:
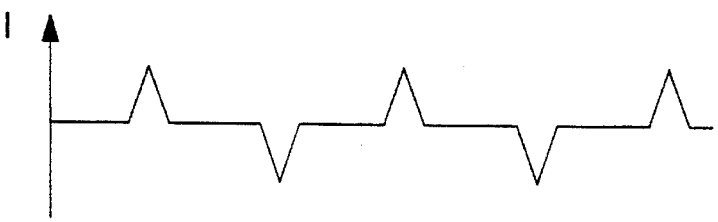
Figure 4C:
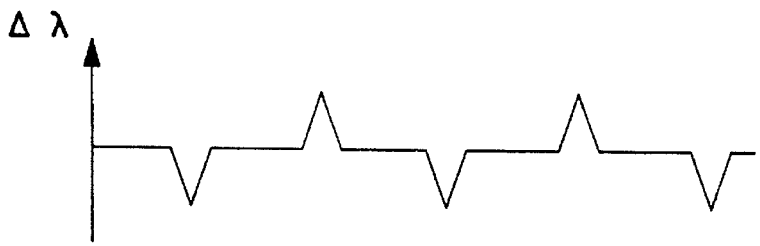

In this second embodiment, an inverter 17a is connected to the output of the differentiating circuit 13, and thereby the phase of the differentiated waveform current as an output signal of the differentiating circuit 13 shown in FIG. 2(b) of the above-described first embodiment is inverted by the inverter 17a. Further, a differentiated waveform current in an opposite phase to the above-described differentiated waveform current shown in FIG. 4(b) is output from the inverter 17a, and the differentiated waveform current inverted in its phase, that is output from the inverter 17a is added to the direct current that is output from the front side electrode D.C. current source 5a, and the sum signal is applied to the LD front side electrode 3a of the wavelength variable laser 11. Then, in this wavelength variable laser 11 the injection ratio γ varies as described in the above-described first embodiment, whereby wavelength chirping as shown in FIG. 4(c) occurs.

Figure 4D:
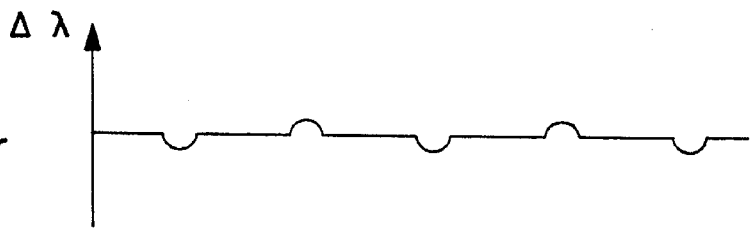

Also in this second embodiment, the wavelength chirping occurring in the optical modulator 2 can be canceled similarly as in the first embodiment shown in FIG. 4(d), whereby the modulated signal light 10 having reduced the wavelength chirping, is emitted from the output facet of the optical modulator 2.

Embodiment 3

A third embodiment of the present invention will be described.

Figure 5:
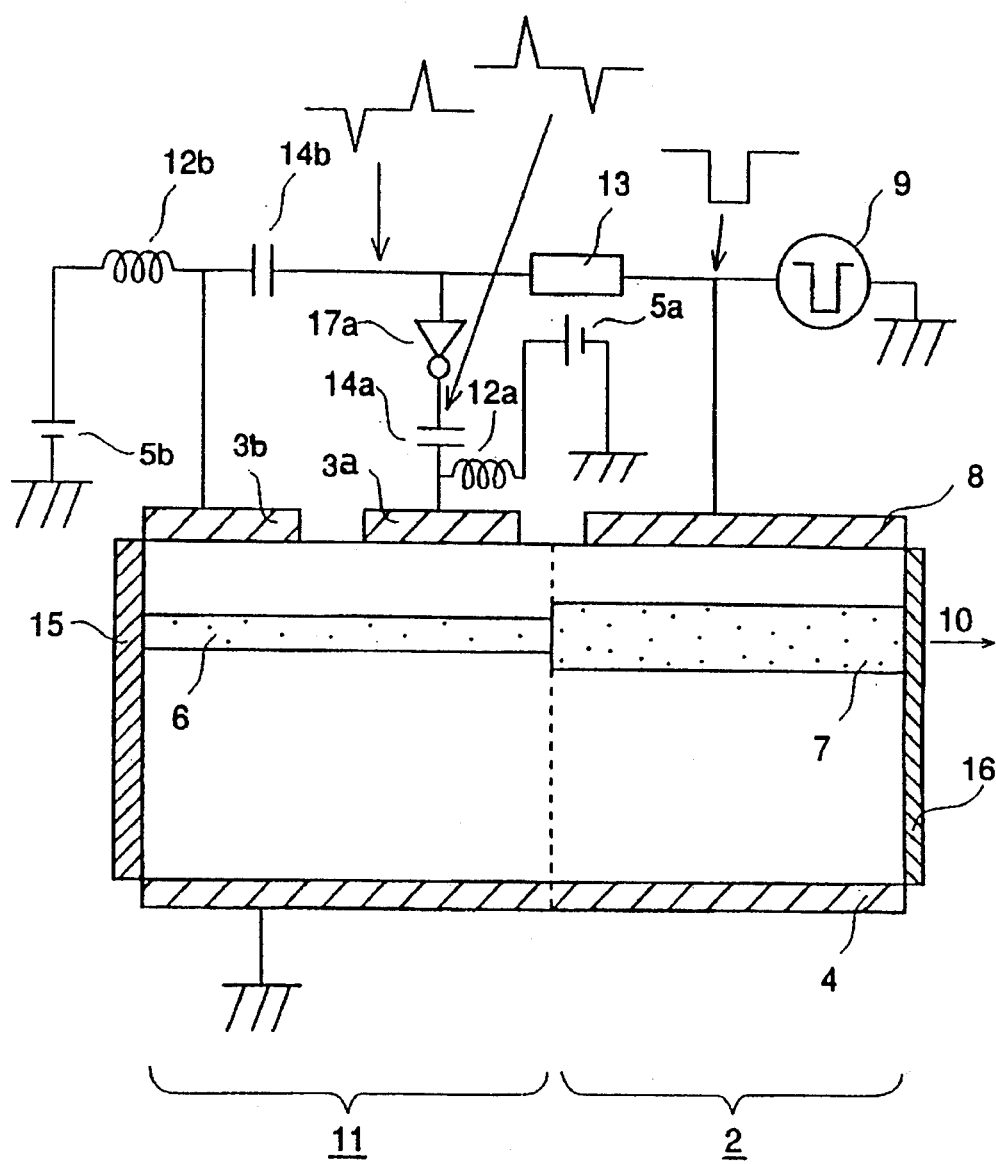
FIG. 5 is a diagram illustrating a structure of an optical modulator according to a third embodiment of the present invention.

FIG. 5 is a diagram showing a construction of an optical modulator according to a third embodiment of the present invention. In the FIG., the same reference numerals used in FIGS. 1 and 3 are used to designate the same or corresponding elements.

FIGS. 6(a)–6(e) are diagrams for explaining the operation of the optical modulator according to the third embodiment of the present invention.

Figure 6A:
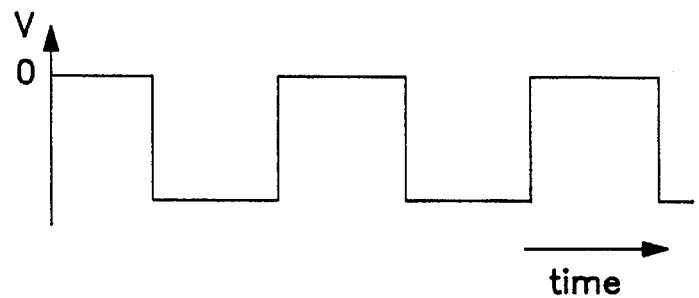
FIGS. 6(a)–6(e) are diagrams for explaining the operation of the optical modulator according to the third embodiment of the present invention.
Figure 6B:
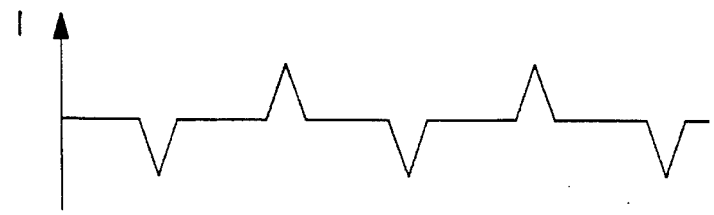
Figure 6C:
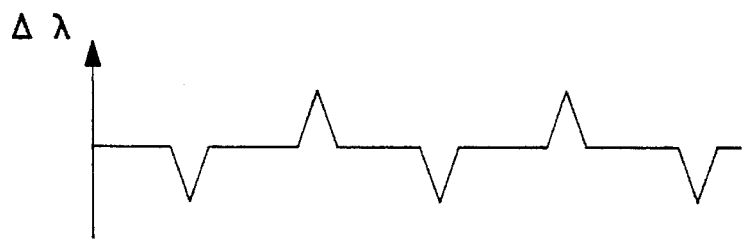
Figure 6D:
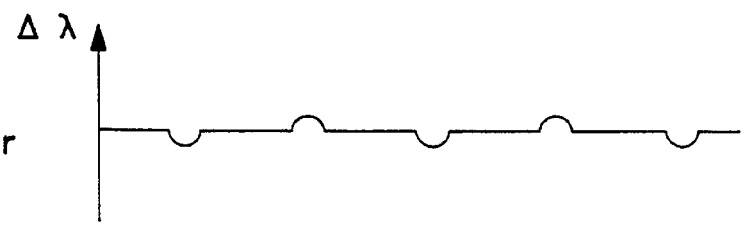
Figure 6E:
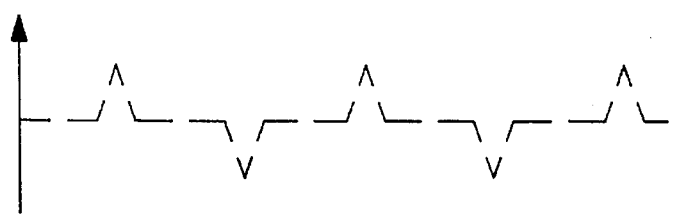

The optical modulator of the first embodiment only applies a differentiated waveform current to the LD rear side electrode 3b of the wavelength variable laser 11 and the optical modulator of the second embodiment only applies the differentiated waveform current inverted in its phase to the LD front side electrode 3a of the wavelength variable laser 11. On the contrary, in this third embodiment the output of the differentiating circuit 13 is divided into two, and one of them is connected to the condenser 14b similarly as in the first embodiment, and the other of them is connected to the inverter 17a similarly as in the second embodiment, whereby the differentiated waveform current shown in FIG. 6(b) is applied to the LD rear side electrode 3b as well as the differentiated waveform current inverted in its phase shown in FIG. 6(e), is applied to the LD front side electrode 3a.

In the optical modulator of this third embodiment having the above-described construction, the total sum of the driving current of the wavelength variable laser 11 is made constant, and the laser light that is output from the wavelength variable laser 11 is stabled, whereby the wavelength chirping is largely reduced.

Embodiment 4

A fourth embodiment of the present invention will be described in the following.

Figure 7:
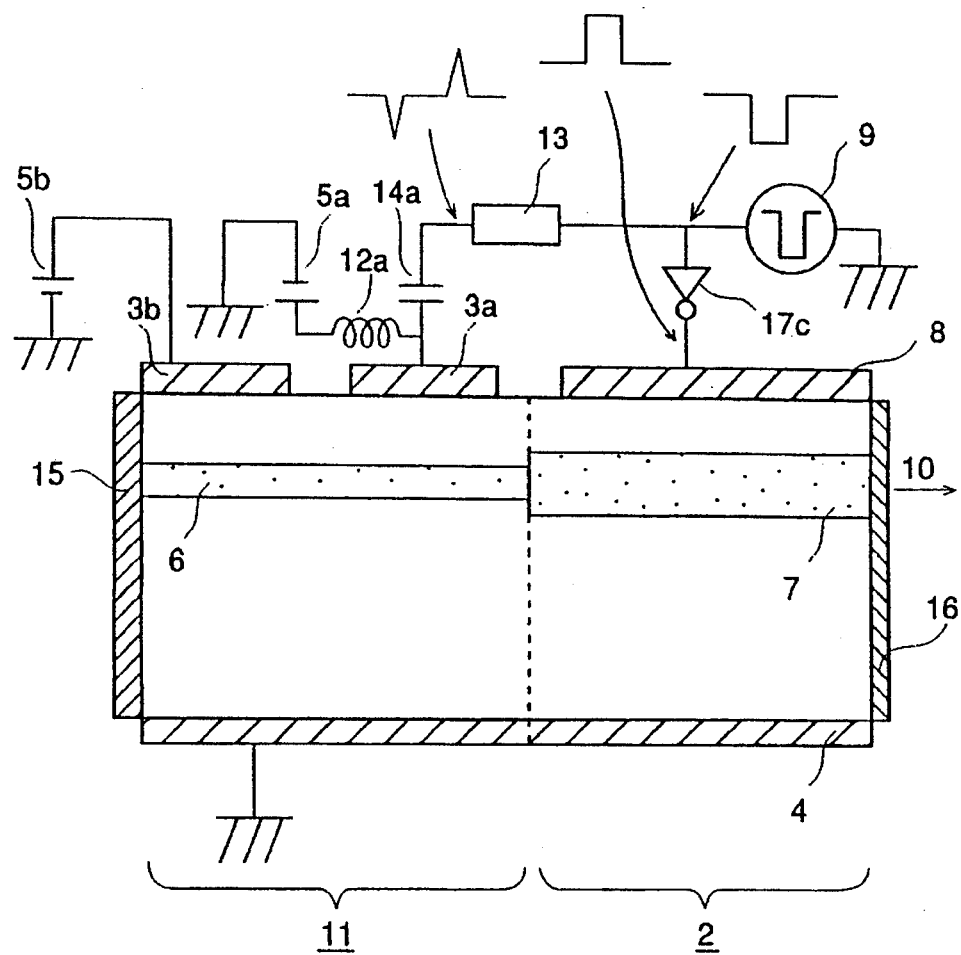
FIG. 7 is a diagram illustrating a structure of an optical modulator according to a fourth embodiment of the present invention.

FIG. 7 is a diagram showing a construction of an optical modulator according to a fourth embodiment of the present invention. In the figure, the same reference numerals used in FIG. 3 are used to designate the same or corresponding elements. Reference numeral 17c designates an inverter connected to the optical modulator negative side electrode 8, and this functions to invert the phase of the modulation signal.

A description is given of the operation of the optical modulator of this fourth embodiment with reference to FIGS. 8(a)–8(d).

Figure 8A:
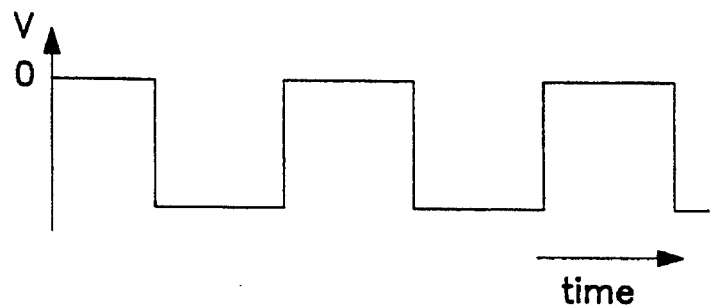
FIGS. 8(a)–8(d) are diagrams for explaining the operation of the optical modulator according to the fourth embodiment of the present invention.
Figure 8B:
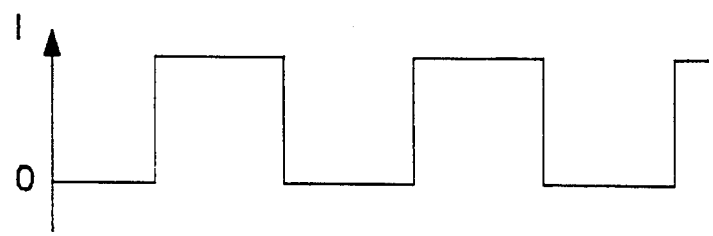

In the above-described second embodiment the inverter 17a is connected to the output of the differentiating circuit 13 and the phase inverted differentiated waveform current is applied to the LD front side electrode 3a. In this fourth embodiment the differentiated waveform current that is output from the differentiating circuit 13 is added in its positive phase via the condenser 14a to the D.C. current that is output from the front side electrode D.C. current source 5a, while the phase of the modulation signal applied to the optical modulator 2 shown in FIG. 8(a) is inverted by the inverter 17c to produce a signal of waveform as shown in FIG. 8(b), whereby the optical modulator 2 is operated by this phase inverted modulation signal and the emitted laser light of the wavelength variable laser 11 is modulated.

Figure 8C:
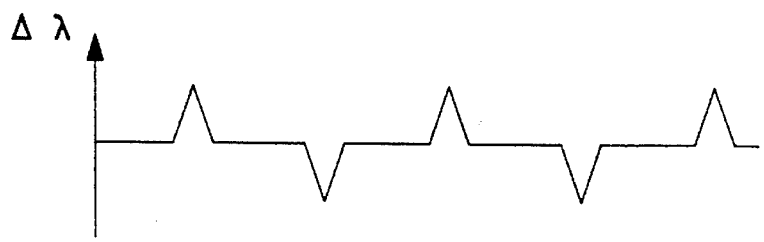
Figure 8D:
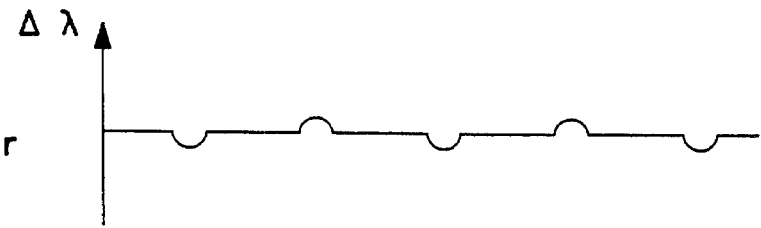

Also in this fourth embodiment, the wavelength chirping (shown in FIG. 8(c)) occurs in the wavelength variable laser 11, and the wavelength chirping occurring in the optical modulator 2 is canceled by this wavelength chirping, whereby the wavelength chirping of the modulated signal light 10 emitted from the optical modulator 2 is largely reduced.

Embodiment 5

A fifth embodiment of the present invention will be described in the following.

Figure 9:
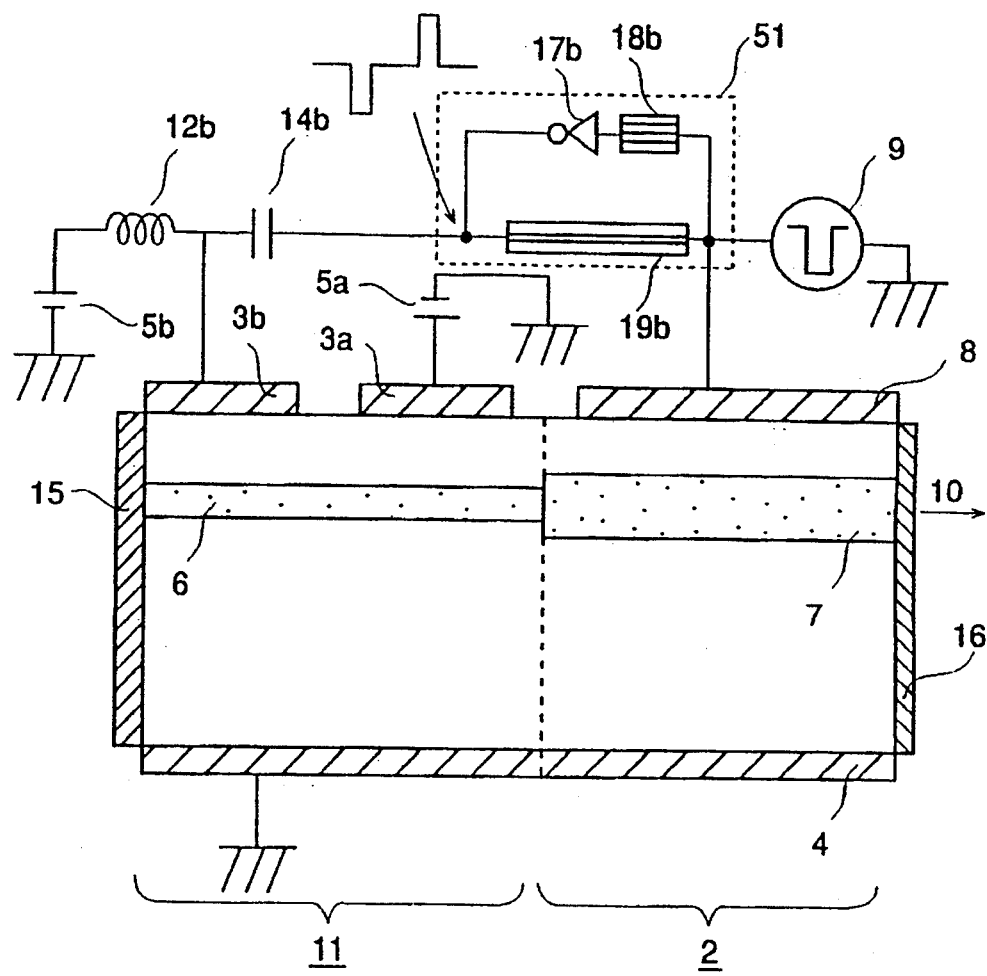
FIG. 9 is a diagram illustrating a structure of an optical modulator according to a fifth embodiment of the present invention.

FIG. 9 is a diagram showing a construction of an optical modulator according to this fifth embodiment. In FIG. 9, the same reference numerals as those in FIG. 1 are used to designate the same or corresponding elements. Reference numeral 51 designates a first bridge circuit that produces a pulse signal from the modulation signal, and this first bridge circuit 51 is connected between the connection node of the optical modulator negative side electrode 8 and the signal voltage source 9, and the condenser 14b. The first bridge circuit 51 is constituted by an inverter 17b, a delay line 18b having a required delay quantity, and a transmission line 19b that produces no delay.

Figure 10A:
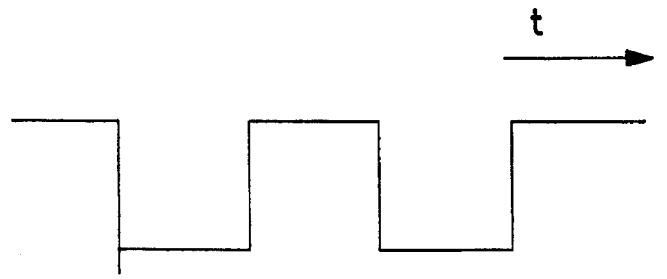
FIGS. 10(a)–10(c) are diagrams for explaining the operation of a first bridge circuit of the optical modulator according to the fifth embodiment of the present invention.
Figure 10B:
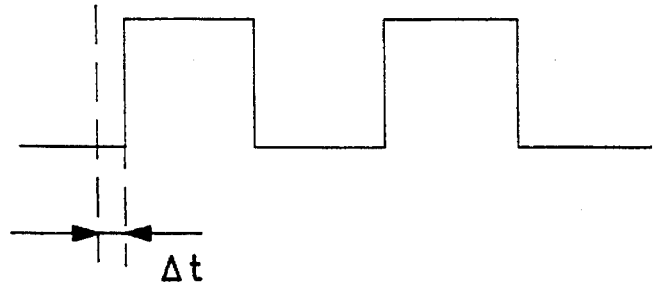
Figure 10C:
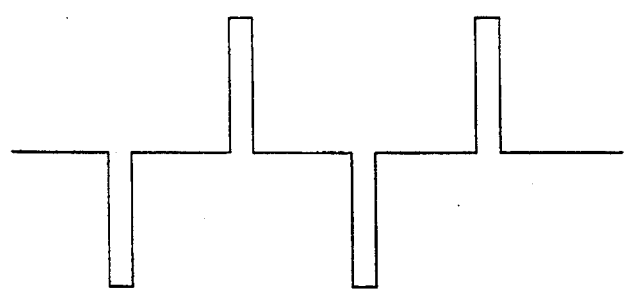

FIGS. 10(a)–10(c) are diagrams for explaining the operation of the first bridge circuit 51, and FIGS. 11(a)–11(d) are diagrams for explaining the operation of the optical modulator according to this fifth embodiment.

In the first embodiment, a differentiated waveform current is produced by differentiating a modulation signal by the differentiating circuit 13, and the differentiated waveform current is added to a direct current that is output from the rear side electrode D.C. current source 5b, to be applied to the LD rear side electrode 3b. In this fifth embodiment, the first bridge circuit 51 is employed in place of the differentiating circuit 13, the pulse signal output from the first bridge circuit 51 is added to a D.C. current that is output from the rear side electrode D.C. current source 5b, to be applied to the LD rear side electrode 3b.

As shown in FIG. 9, the first bridge circuit 51 comprises a serial connection of the delay line 18b and the inverter 17b, and a transmission line 19b producing no delay, that is connected in parallel with the serial connection, and the input of the first bridge circuit 51 is connected to the optical modulator negative side electrode 8 and the signal voltage source 9, and the output of the first bridge circuit 51 is connected to the D.C. current blocking condenser 14b.

A description is given of the operation of the optical modulator according to the fifth embodiment.

First of all, the modulation signal output from the signal voltage source 9 is sent to the optical modulator negative side electrode 8, and sent to the first bridge circuit 51.

Then, the modulation signal that is input to the first bridge circuit 51 is sent out to the transmission line 19b and the delay line 18b, and the modulation signal sent out to the transmission line 19b is output from the transmission line 19b as a positive phase signal as shown in FIG. 10(a), and the modulation signal sent out to the delay line 18b is delayed by Δt by the delay line 18b as shown in FIG. 10(b), and is made a reverse phase signal by the inverter 17b. Furthermore, the positive phase signal and the reverse phase signal are added to with each other at the output end of the first bridge circuit 51, and a pulse signal shown in FIG. 10(c) and in FIG. 11(b) is output from the output end.

Next, the above pulse signal is added passing through the condenser 14b to the D.C. current that is output from the rear side electrode D.C. current source 5b, and is applied to the LD rear side electrode 3b. The operation of the wavelength variable laser 11 to which a driving current that is obtained by a pulse signal being added to the D.C. current, is the same as the operation described in the first embodiment.

In this fifth embodiment, the driving current of the wavelength variable laser 11 is changed by the pulse signal (shown in FIG. 11(b)), and wavelength chirping (shown in FIG. 11(c)) that is reverse to the wavelength chirping that occurs in the optical modulator 2 occurs in the output laser light from the wavelength variable laser 11, whereby the wavelength chirping that occurs in the optical modulator 2 can be canceled, and a modulated signal light 10 including reduced wavelength chirping is emitted from the output facet of the optical modulator 2.

Embodiment 6

A description is given of a sixth embodiment of the present invention as in the following.

Figure 12:
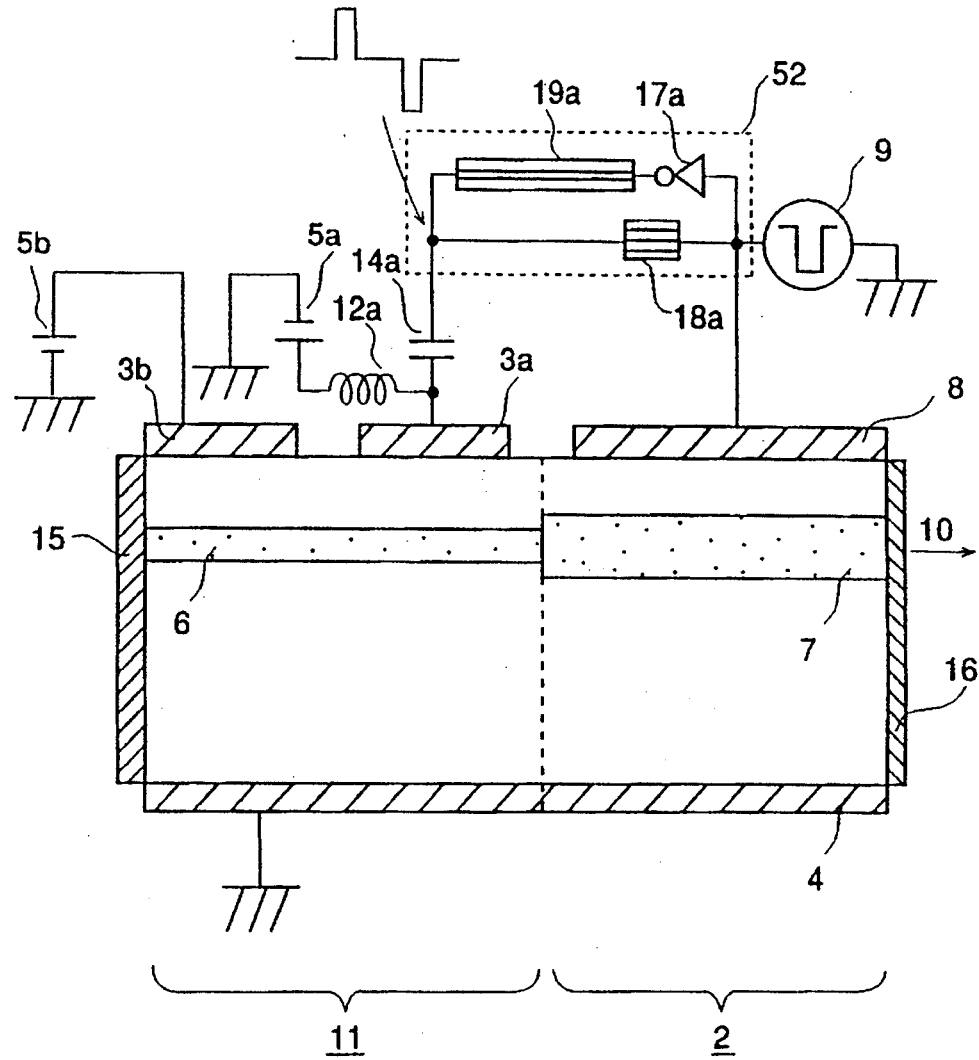
FIG. 12 is a diagram illustrating a structure of an optical modulator according to a sixth embodiment of the present invention.

FIG. 12 is a diagram showing a construction of an optical modulator according to a sixth embodiment of the present invention. In FIG. 12, the same reference numerals used in FIG. 3 are used to designate the same or corresponding elements.

Reference numeral 52 designates a second bridge circuit that produces a pulse signal from the modulated signal. That second bridge circuit 52 is connected between the connection node of the optical modulator negative side electrode 8 and the signal voltage source 9, and the condenser 14a. This second bridge circuit 52 is constituted by the inverter 17a, the delay line 18a having a required delay quantity, and a transmission line 19a producing no delay.

FIGS. 13(a)–13(d) are diagrams for explaining the operation of the optical modulator according to this sixth embodiment.

In the above-described second embodiment, a differentiated waveform current is produced by differentiating the modulation signal by the differentiating circuit 13, the differentiated waveform current is phase-inverted by the inverter 17a, and the phase-inverted differentiated waveform current is added to the D.C. current that is output from the front side electrode D.C. current source 5a, to be applied to the LD front side electrode 3a. In this sixth embodiment, a second bridge circuit 52 that outputs a pulse signal that is in a reverse phase to a pulse signal that is output from the first bridge circuit 51 is employed, and a pulse signal that is output from the second bridge circuit 52 is added to the D.C. current that is output from the front side electrode D.C. current source 5a, to be applied to the LD front side electrode 3a.

Figure 13A:
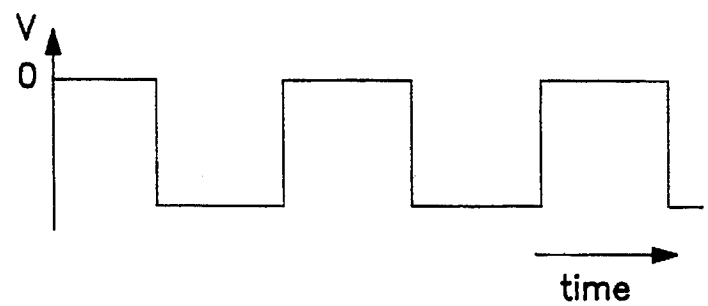
FIGS. 13(a)–13(d) are diagrams for explaining the operation of the optical modulator according to the sixth embodiment of the present invention.
Figure 13B:
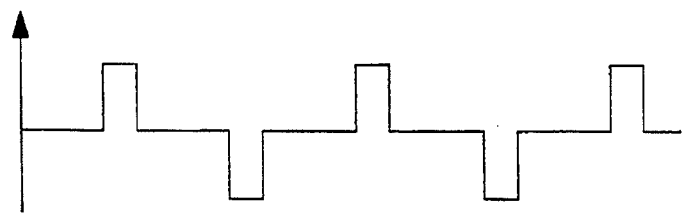

That is, as shown in FIG. 12, the second bridge circuit 52 comprises a serial connection of the inverter 17a and the transmission line 19a producing no delay, and a delay line 18a that is connected in parallel with the serial connection. The input of this second bridge circuit 52 is connected to the connection node of the optical modulator negative side electrode 8 and the signal voltage source 9, and the output of the second bridge circuit 52 is connected to the D.C. current blocking condenser 14a. The output signal of the second bridge circuit 52 becomes a pulse signal of a reverse phase to the pulse signal shown in FIG. 11(b) in the fifth embodiment, as shown in FIG. 13(b).

Figure 13C:
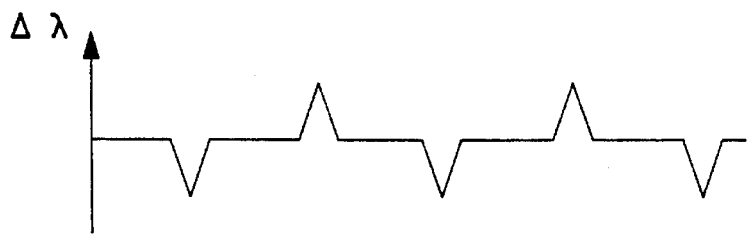
Figure 13D:
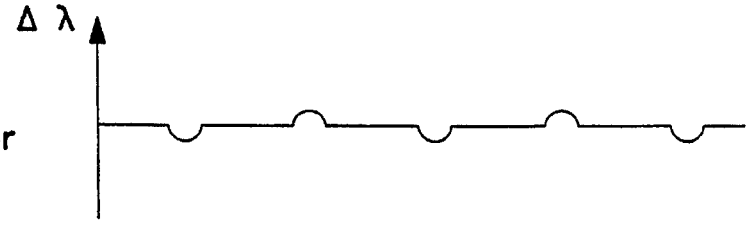

Then, similarly as the differentiated waveform current which is reverse in its phase as in the second embodiment, the reverse phase pulse signal and the D.C. current from the front side electrode D.C. current source 5a are applied to the LD front side electrode 3a, whereby the wavelength chirping shown in FIG. 13(c) occurs in the wavelength variable laser 11.

Also in this sixth embodiment, a pulse signal that is output from the second bridge circuit 52 is added to the driving current for the wavelength variable laser 11, and a wavelength chirping occurs in the laser light that is output from the wavelength variable laser 11, whereby the wavelength chirping occurring in the optical modulator 2 is canceled, and the wavelength chirping of the modulation signal light 10 that is emitted from the optical modulator 2 is reduced.

Embodiment 7

Figure 14:
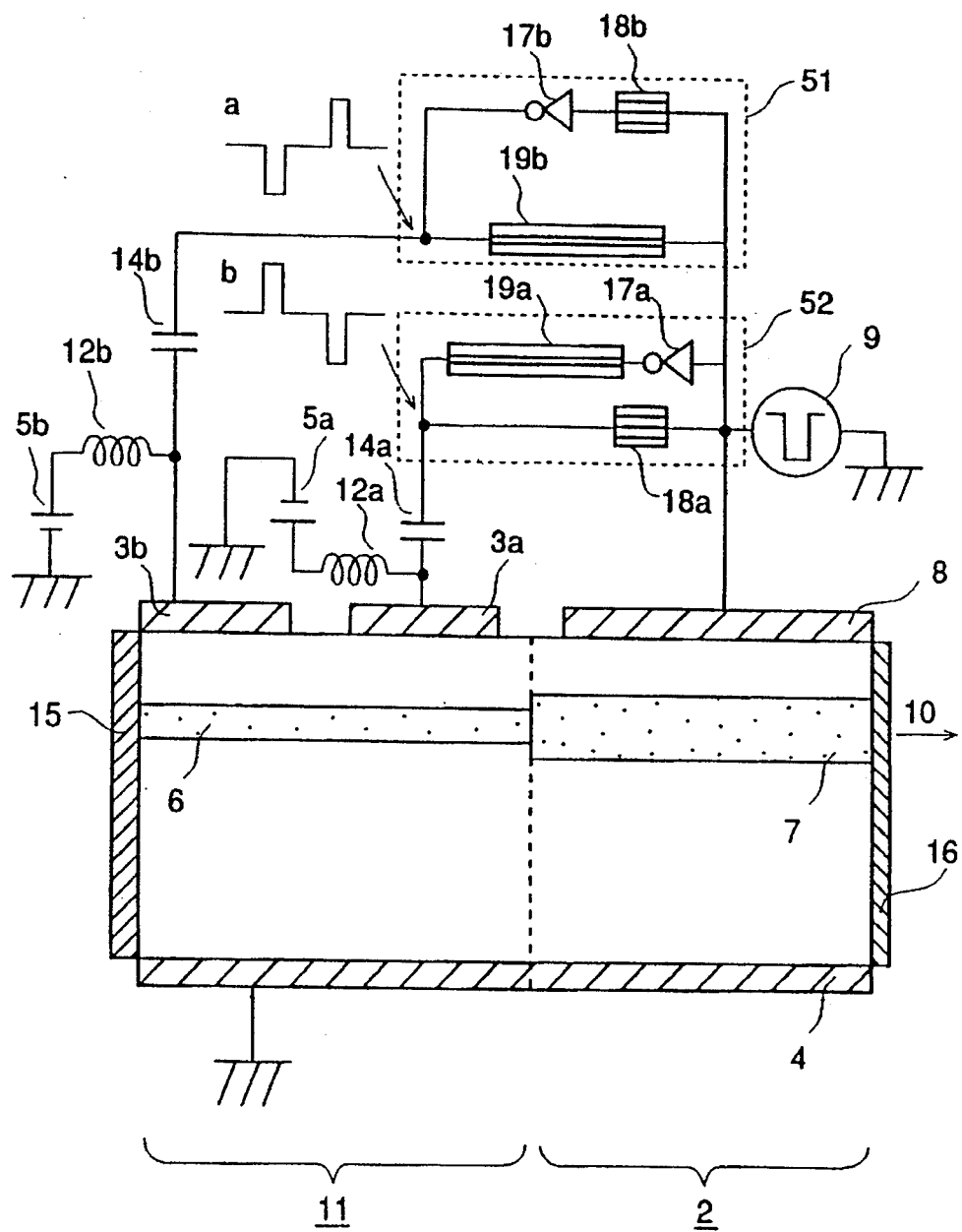
FIG. 14 is a diagram illustrating a structure of an optical modulator according to a seventh embodiment of the present invention.
Figure 15A:
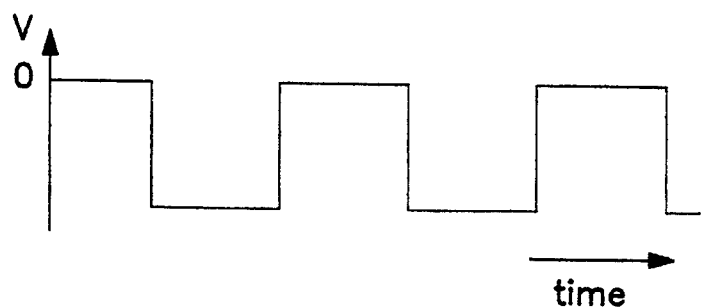
FIGS. 15(a)–15(e) are diagrams for explaining the operation of the optical modulator according to the seventh embodiment of the present invention.
Figure 15B:
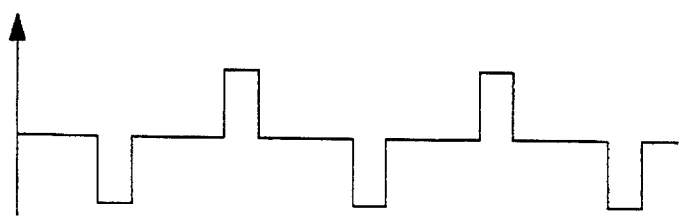
Figure 15C:
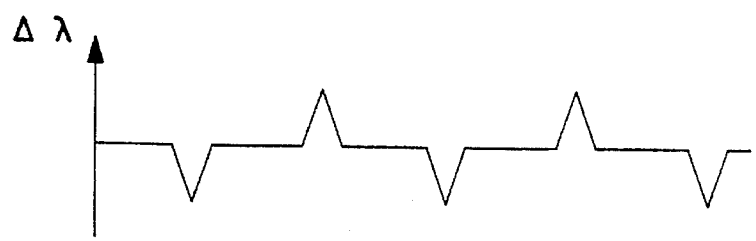
Figure 15D:
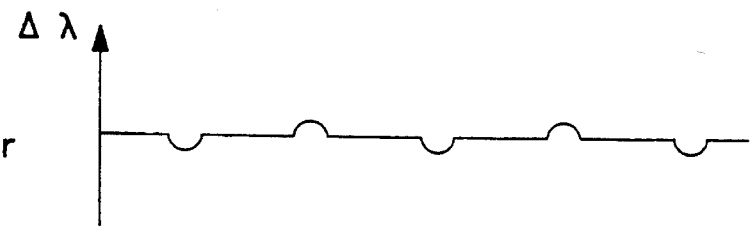
Figure 15E:
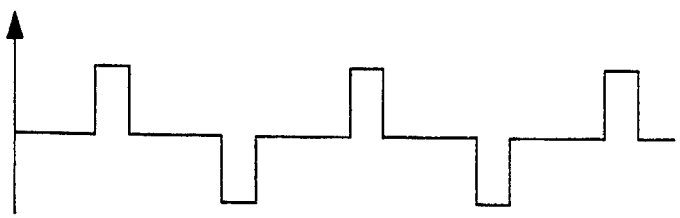

An optical modulator according to a seventh embodiment of the present invention is provided with both of the first bridge circuit 51 of the fifth embodiment and the second bridge circuit 52 of the sixth embodiment, as shown in FIG. 14. This optical modulator performs an operation similar to that of the third embodiment by employing the first pulse signal (a) that is output from the first bridge circuit 51, and the second pulse signal (b) that is output from the second bridge circuit 52.

Also in this seventh embodiment, similarly as the optical modulator according to the third embodiment, the total sum of the driving current of the wavelength variable laser 11 is constant, and the laser light that is output from the wavelength variable laser 11 is stabled, thereby reducing the wavelength chirping.

Embodiments 8–11

An eighth embodiment of the present invention will be described in the following.

Figure 16:
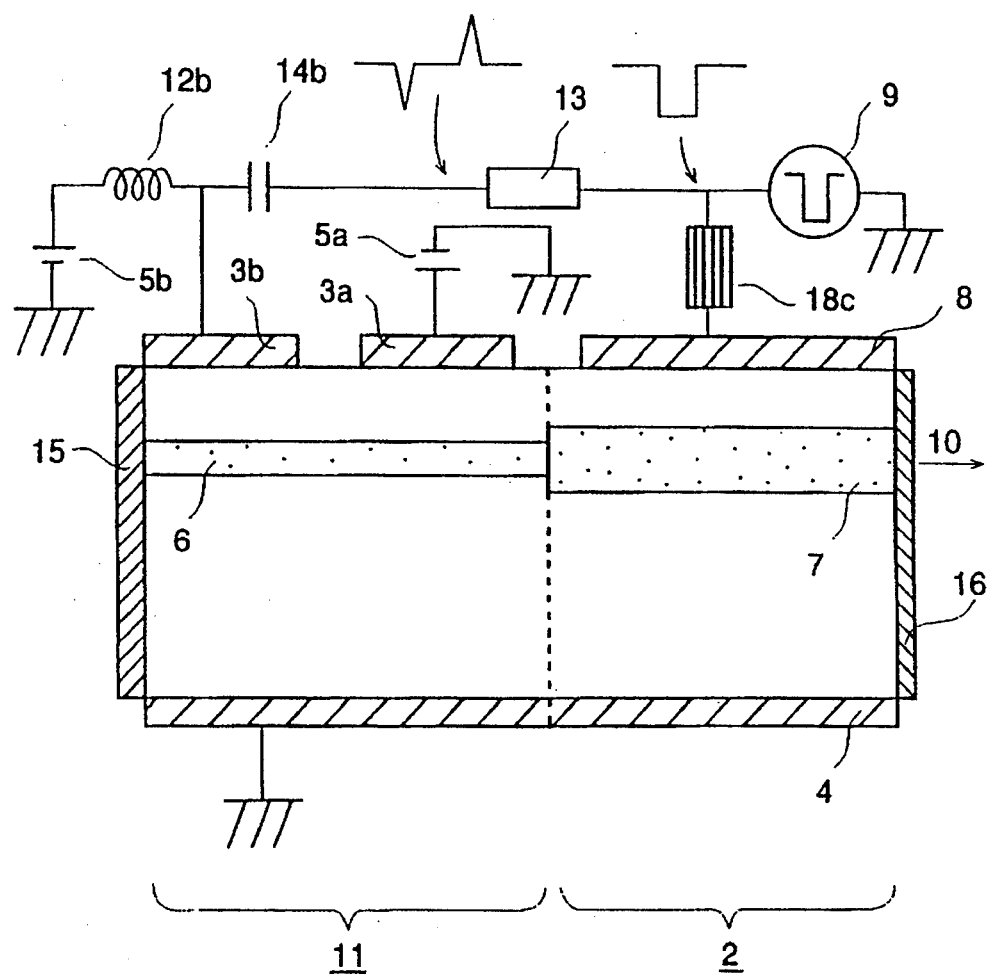
FIG. 16 is a diagram illustrating a structure of an optical modulator according to an eighth embodiment of the present invention.

FIG. 16 is a diagram showing a construction of an optical modulator according to an eighth embodiment of the present invention. In FIG. 16, the same reference numerals used in FIG. 1 in the first embodiment are used to designate the same or corresponding elements. Reference numeral 18c designates a delay line producing a required delay quantity.

The optical modulator according to this eighth embodiment is constituted by providing a delay line 18c between the connection node of the signal voltage source 9 and the optical modulator negative side electrode 8, in the optical modulator according to the first embodiment.

While in the above first embodiment it is constructed such that a modulation signal is converted to a differentiated waveform current and the driving current of the wavelength variable laser 11 is changed by this differentiated waveform current, because a differentiating circuit 13 or the like is provided in this path, the timing of the change of the driving current of the wavelength variable laser 11 is delayed with relative to the timing of the change of absorption/transmission of the optical modulator 2, that occur by the modulation signal which is sent to the optical modulator 2, thereby reducing the canceling effect of the wavelength chirping. The optical modulator of this eighth embodiment is intended to compensate the above-described delay by means of the delay line 18c.

In the above-described eighth embodiment, the wavelength chirping occurring in the wavelength variable laser 11 and the wavelength chirping occurring in the optical modulator 2 can be canceled synchronized With each other, and the wavelength chirping of the modulated signal light 10 that is emitted from the output facet of the optical modulator 2 can be effectively reduced.

Figure 17:
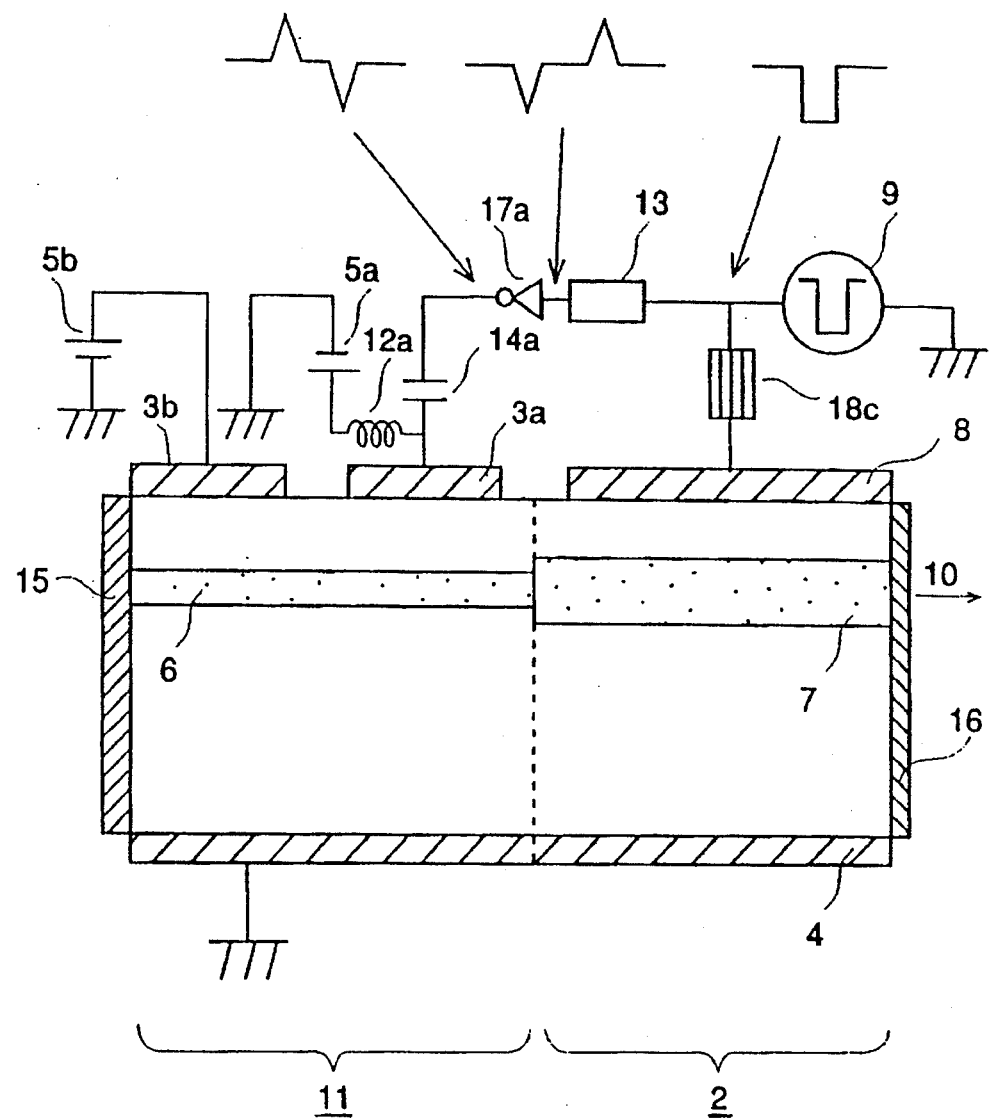
FIG. 17 is a diagram illustrating a structure of an optical modulator according to a ninth embodiment of the present invention.
Figure 18:
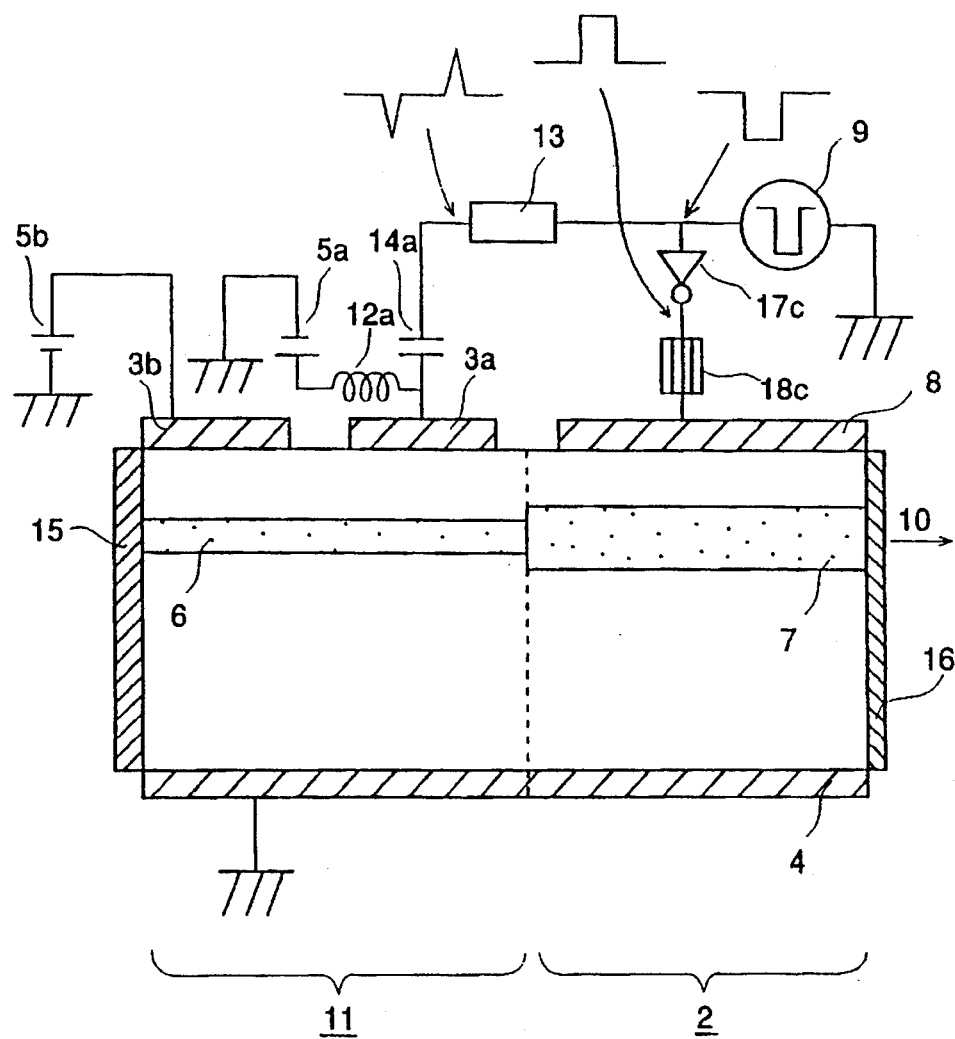
FIG. 18 is a diagram illustrating a structure of an optical modulator according to a tenth embodiment of the present invention.
Figure 19:
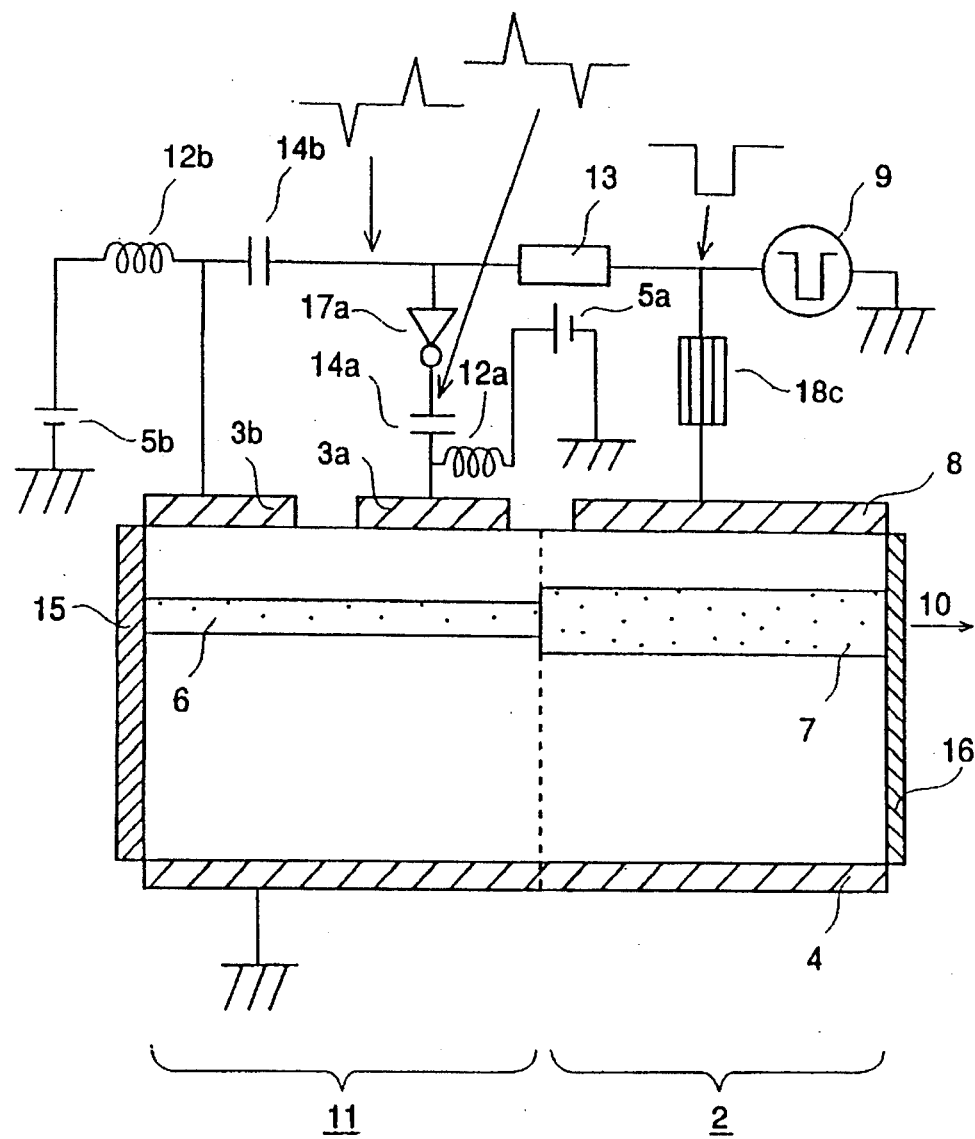
FIG. 19 is a diagram illustrating a structure of an optical modulator according to an eleventh embodiment of the present invention.

The ninth embodiment shown in FIG. 17 is constituted by the optical modulator of the second embodiment provided with the delay line 18c, the tenth embodiment shown in FIG. 18 is constituted by the optical modulator of the fourth embodiment provided with the delay line 18c, and the eleventh embodiment shown in FIG. 19 is constituted by the optical modulator of the third embodiment provided with the delay line 18c. In any optical modulator, the wavelength chirping that occurs in the variable wavelength laser 11 and the wavelength chirping occurring in the optical modulator 2 are canceled with occurring synchronized with each other, whereby the wavelength chirping of the optical signal light 10 that is emitted from the output facet of the optical modulator 2 can be effectively reduced.

Embodiment 12

Figure 20:
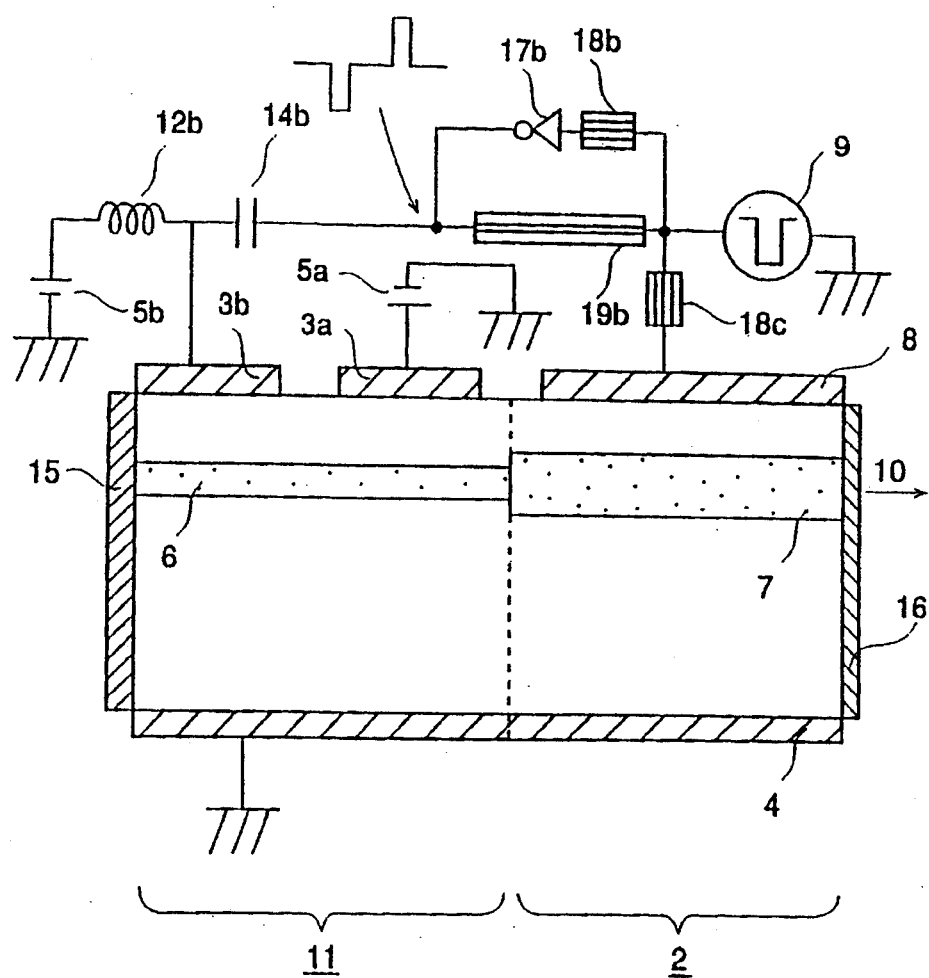
FIG. 20 is a diagram illustrating a structure of an optical modulator according to a twelfth embodiment of the present invention.
Figure 21:
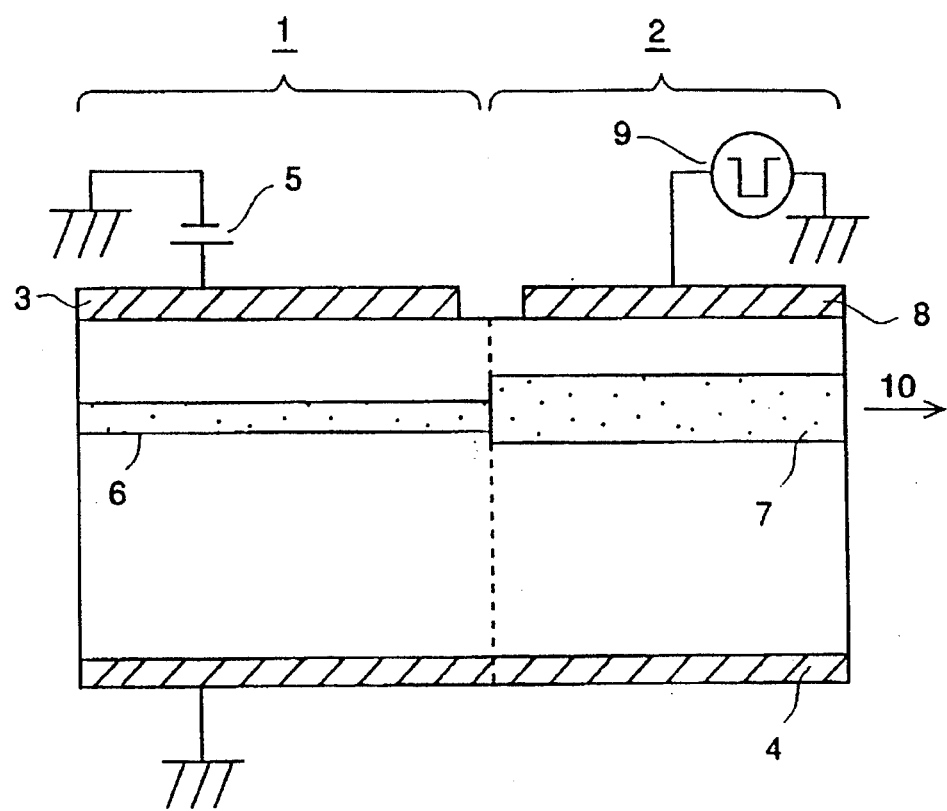
FIG. 21 is a diagram illustrating a structure of an optical modulator with a DFB laser according to the prior art.

While the above-described eighth to eleventh embodiments are constituted to compensate the delay time due to the differentiating circuit 13 that is provided in the optical modulator, the optical modulator according to the fifth embodiment may be provided with the delay line 18c as shown in FIG. 20.

Also in this twelfth embodiment, the wavelength chirping that occurs in the wavelength variable laser 11 and the wavelength chirping occurring in the optical modulator 2 can be canceled with occurring synchronized with each other, whereby the modulation signal light 10 that is emitted from the output facet of the optical modulator 2 can be effectively reduced.

Heretofore, by any combination of the above-described first to twelfth embodiments, it is, of course, possible to reduce the wavelength chirping.

As is evident from the foregoing description, according to the present invention, in an optical modulator provided with a laser light source emitting a laser light to be modulated by an optical modulator, the laser light source is made a wavelength variable laser that emits a laser light which wavelength is variable, and there are provided modulation signal means for applying a modulation signal to the optical modulator, signal producing means for producing and outputting a signal in response to the change in the voltage of the modulation signal, driving current generating means for generating a driving current to be applied to the laser light source, and signal synthesizing means for synthesizing the output signal of the signal producing means and the driving current, and applying the synthesized output to the laser light source. Therefore, wavelength chirping reverse to the wavelength chirping occurring in the optical modulator occurs in the wavelength variable laser and in the laser light, that is emitted from the laser light source by the output signal of the signal producing means due to that the driving current of the laser light source varies in response to the change in the modulation signal. Thereby, the wavelength chirping arising in the optical modulator is canceled, the wavelength chirping of the modulation signal light that is emitted from the optical modulator is reduced, and a high speed long distance transmission is obtained.

What is claimed is:

1. An optical modulator comprising:
   a modulator for modulating laser light;
   a variable wavelength laser for emitting laser light of variable wavelength to be modulated by said modulator, a first reflectivity film on a rear facet of said variable wavelength laser, and a second reflectivity film having a lower reflectivity than the first reflectivity film on a front, output facet of said modulator, said modulator and said variable wavelength laser being an integrated semiconductor structure;
   means for generating a modulation signal applied to said modulator;
   means receiving the modulation signal for producing an electrical output signal in response to changes in the modulation signal;
   means for generating a driving current applied to said laser to produce laser light;
   means for synthesizing the electrical output signal and the driving current to produce a synthesized electrical output signal and for applying the synthesized electrical output to said laser, and including a differentiating circuit for differentiating the modulation signal to produce a differentiated waveform current;
   a common grounding electrode on a rear surface of said integrated semiconductor structure; and
   at least two spaced apart front side electrodes disposed on a front surface of said variable wavelength laser arranged in a resonator length direction including a front side electrode proximate said modulator and a front side electrode remote from said modulator, said means for generating a modulation signal being electrically connected between a modulator electrode disposed on the front surface at said modulator and said common grounding electrode, said means for generating a driving current including a front side electrode D.C. current source and a rear side electrode D.C. current source outputting respective D.C. currents to said front side electrodes proximate and remote from said modulator, respectively, and said means for synthesizing the differentiated waveform current that has passed through a D.C. blocking condenser and the driving current that has passed through an A.C. blocking coil.

2. The optical modulator of claim 1 wherein said means for generating a modulation signal includes a delay line having a first delay connected to said modulator electrode for delaying the modulation signal.

3. The optical modulator of claim 1 wherein said differentiating circuit is connected to said front side electrode remote from said modulator via said D.C. blocking condenser and said rear side electrode D.C. current source is connected to said front side electrode remote from said modulator via said A.C. blocking coil.

4. The optical modulator of claim 1 wherein said means for producing an electrical output signal includes an inverter connected at an output end of said differentiating circuit for inverting the differentiated waveform current, said inverter being connected to said front side electrode proximate said modulator via said D.C. blocking condenser, said front side electrode D.C. current source being connected to said front side electrode proximate said modulator via said A.C. blocking coil, and said rear side electrode D.C. current source being connected to said front side electrode remote from said modulator.

5. The optical modulator of claim 1 wherein said means for producing an electrical output signal includes an inverter connected at an output end of said differentiating circuit for inverting the differentiated waveform current, said inverter being connected to said front side electrode proximate said modulator via a D.C. blocking condenser and said front side electrode D.C. current source being connected to said front side electrode proximate said modulator via an A.C. blocking coil, said differentiating circuit being connected to said front side electrode remote from said modulator via another D.C. blocking condenser, and said rear side electrode D.C. current source being connected to said front side electrode remote from said modulator.

6. The optical modulator of claim 1 wherein said means for generating a modulation signal includes an inverter for inverting the modulation signal, said differentiating circuit being connected to said front side electrode proximate said modulator via said D.C. blocking condenser, said front side electrode D.C. current source being connected to said front side electrode proximate said modulator via said A.C. blocking coil, and said rear side electrode D.C. current source being connected to said front side electrode remote from said modulator, the inverted modulation signal being applied to said modulator electrode.

7. An optical modulator comprising:

a modulator for modulating laser light;

a variable wavelength laser for emitting laser light off variable wavelength to be modulated by said modulator, a first reflectivity film on a rear facet of said variable wavelength laser, and a second reflectivity film having a lower reflectivity than the first reflectivity film on a front, output facet of said modulator, said modulator and said variable wavelength laser being an integrated semiconductor structure;

means for generating a modulation signal applied to said modulator;

means receiving the modulation signal for producing an electrical output signal in response to changes in the modulation signal;

means for generating a driving current applied to said laser to produce laser light;

means for synthesizing the electrical output signal and the driving current to produce a synthesized electrical output signal and for applying the synthesized electrical output to said laser, and comprising a bridge circuit including a transmission line producing no delay, a delay line having a first delay, and an inverter for adding a modulation signal delayed by said delay line and a modulation signal without delay in reverse phase to produce and output a pulse signal having a delay time difference;

a common grounding electrode on a rear surface of said integrated semiconductor structure;

at least two spaced apart front surface electrodes on a front surface of said variable wavelength laser in a resonator length direction including a front side electrode proximate said modulator and a front side electrode remote from said modulator, said means for generating a modulation signal being electrically connected between a modulator electrode disposed on the front surface at said modulator and said common grounding electrode, said means for generating a driving current including a front side electrode D.C. current source and a rear side electrode D.C. current source outputting respective D.C. currents to said front side electrodes proximate and remote from said modulator, respectively, and said means for synthesizing the pulse signal that has passed through a D.C. blocking condenser and the driving current that has passed through an A.C. blocking coil.

8. The optical modulator of claim 7 wherein said means for generating a modulation signal includes a delay line having a first delay connected to said modulator electrode for delaying the modulation signal.

9. The optical modulator of claim 7 wherein said bridge circuit comprises said delay line and said inverter connected in series with each other and said transmission line connected in parallel with the serial connection of said delay line and said inverter, said front electrode proximate said modulator, said first bridge circuit is connected to said front side electrode remote from said modulator via said D.C. blocking condenser, and said rear side electrode D.C. current source is connected to said front side electrode remote from said modulator via said A.C. blocking coil.

10. The optical modulator of claim 7 wherein said bridge circuit comprises said inverter and said transmission line connected in series with each other and said delay line connected in parallel with the serial connection of said inverter and transmission line, said bridge circuit being connected to said front side electrode proximate said modulator via said D.C. blocking condenser, said front side electrode D.C. current source being connected to said front side electrode remote from said modulator via said A.C. blocking coil, said rear side electrode D.C. current source being connected to said front side electrode remote from said modulator.

11. The optical modulator of claim 7 wherein said bridge circuit comprises a first bridge circuit producing and outputting a first pulse signal including said delay line connected in series with said inverter and said transmission line connected in parallel with the serial connection of said delay line and said inverter, and a second bridge circuit producing and outputting a second pulse signal and including a second inverter and a second transmission line connected in series with each other and a second delay line connected in parallel with the serial connection of said second inverter and said second transmission line, said second bridge circuit being connected to said front side electrode proximate said modulator via a D.C. current blocking condenser, said front side electrode D.C. current source being connected to said front side electrode proximate said modulator via an A.C. blocking coil, said first bridge circuit being connected to said front side electrode remote from said modulator via a second D.C. blocking condenser, and said rear side electrode D.C. current source being connected to said front side electrode remote from said modulator via a second A.C. blocking coil.

\* \* \* \* \*